United States Patent
Lai et al.

(10) Patent No.: US 11,908,731 B2
(45) Date of Patent: Feb. 20, 2024

(54) VIA-FIRST SELF-ALIGNED INTERCONNECT FORMATION PROCESS

(71) Applicant: Taiwan Semiconductor Manufacturing Co., Ltd., Hsinchu (TW)

(72) Inventors: Yu-Tse Lai, Zhubei (TW); Ya Hui Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 213 days.

(21) Appl. No.: 17/371,556

(22) Filed: Jul. 9, 2021

(65) Prior Publication Data

US 2022/0367252 A1 Nov. 17, 2022

Related U.S. Application Data

(60) Provisional application No. 63/188,205, filed on May 13, 2021.

(51) Int. Cl.
*H01L 21/768* (2006.01)
*H01L 23/522* (2006.01)

(52) U.S. Cl.
CPC .. *H01L 21/76816* (2013.01); *H01L 21/76897* (2013.01); *H01L 23/5226* (2013.01)

(58) Field of Classification Search
CPC ......... H01L 21/76816; H01L 21/76897; H01L 23/5226; H01L 21/76834; H01L 21/31144; H01L 21/76813; H01L 21/76832; H01L 21/76811; H01L 21/76802; H01L 21/76829; H01L 21/76843; H01L 21/76877; H01L 21/0337; H01L 23/53295; H01L 23/5386; H01L 23/5283
See application file for complete search history.

(56) References Cited

U.S. PATENT DOCUMENTS

| 6,287,960 | B1 * | 9/2001 | Lao ................. H01L 21/76813 438/743 |
| 7,473,635 | B2 | 1/2009 | Iba |
| 9,679,804 | B1 * | 6/2017 | Chen ................. H01L 21/76811 |
| 9,893,011 | B2 | 2/2018 | Bao et al. |
| 2004/0053501 | A1 * | 3/2004 | Brennan ............. H01L 23/5226 257/E23.145 |
| 2010/0308469 | A1 * | 12/2010 | Tsai ................. H01L 23/5226 257/E21.585 |

(Continued)

FOREIGN PATENT DOCUMENTS

| CN | 104040711 A | 9/2014 |
| JP | H10163316 A | 6/1998 |
| JP | 2004281936 A | 10/2004 |

*Primary Examiner* — Shahed Ahmed
*Assistant Examiner* — Vicki B. Booker
(74) *Attorney, Agent, or Firm* — Slater Matsil, LLP

(57) ABSTRACT

A structure includes a dielectric layer, and a metal line in the dielectric layer. The metal line has a first straight edge and a second straight edge extending in a lengthwise direction of the metal line. The first straight edge and the second straight edge are parallel to each other. A via is underlying and joined to the metal line. The via has a third straight edge underlying and vertically aligned to the first straight edge, and a first curved edge and a second curved edge connecting to opposite ends of the third straight edge.

20 Claims, 35 Drawing Sheets

(56) References Cited

U.S. PATENT DOCUMENTS

2011/0212616 A1     9/2011  Seidel et al.
2015/0262912 A1     9/2015  Ting
2017/0365508 A1*   12/2017  Shiu .................... H01L 21/0332

* cited by examiner

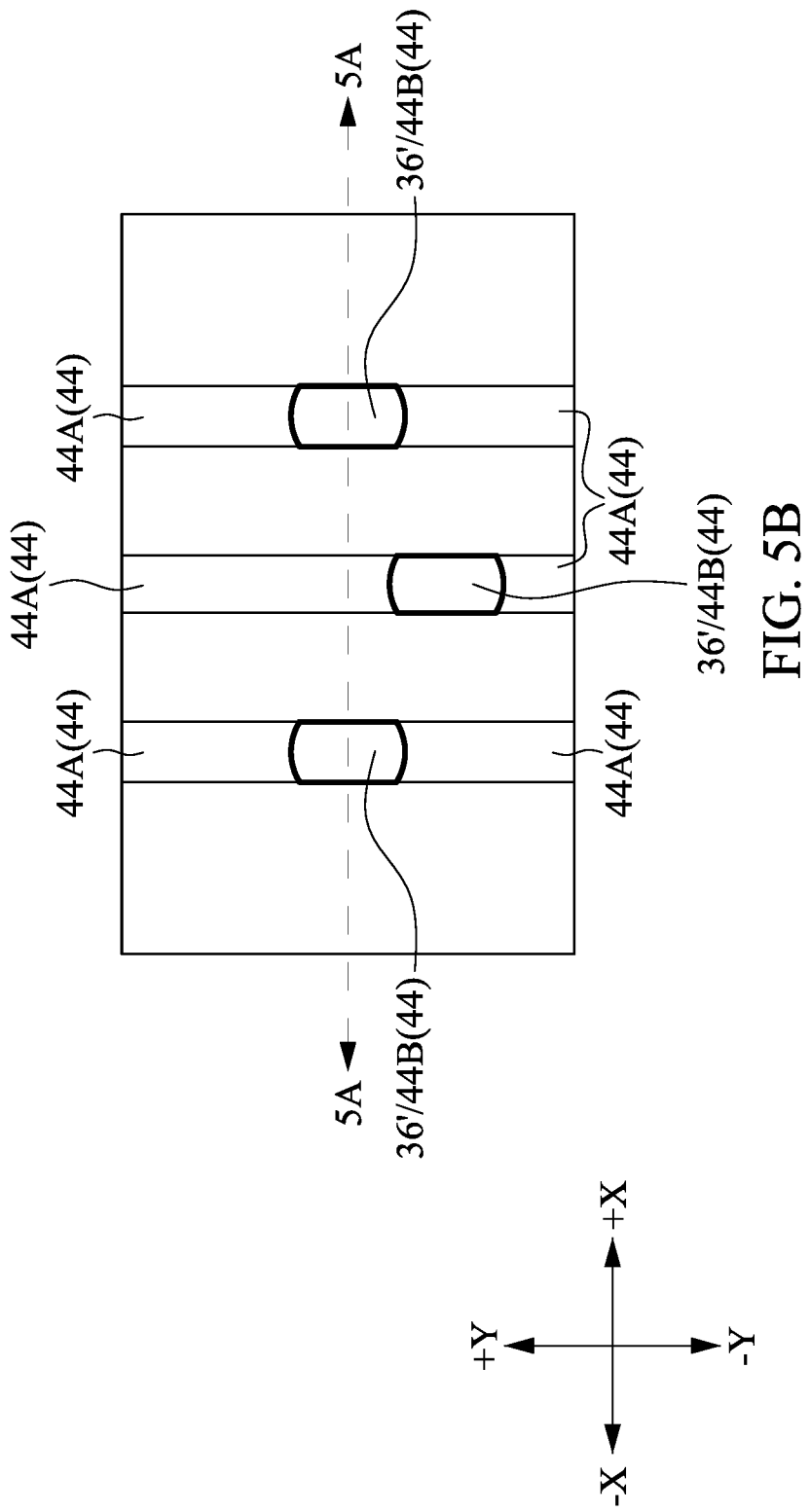

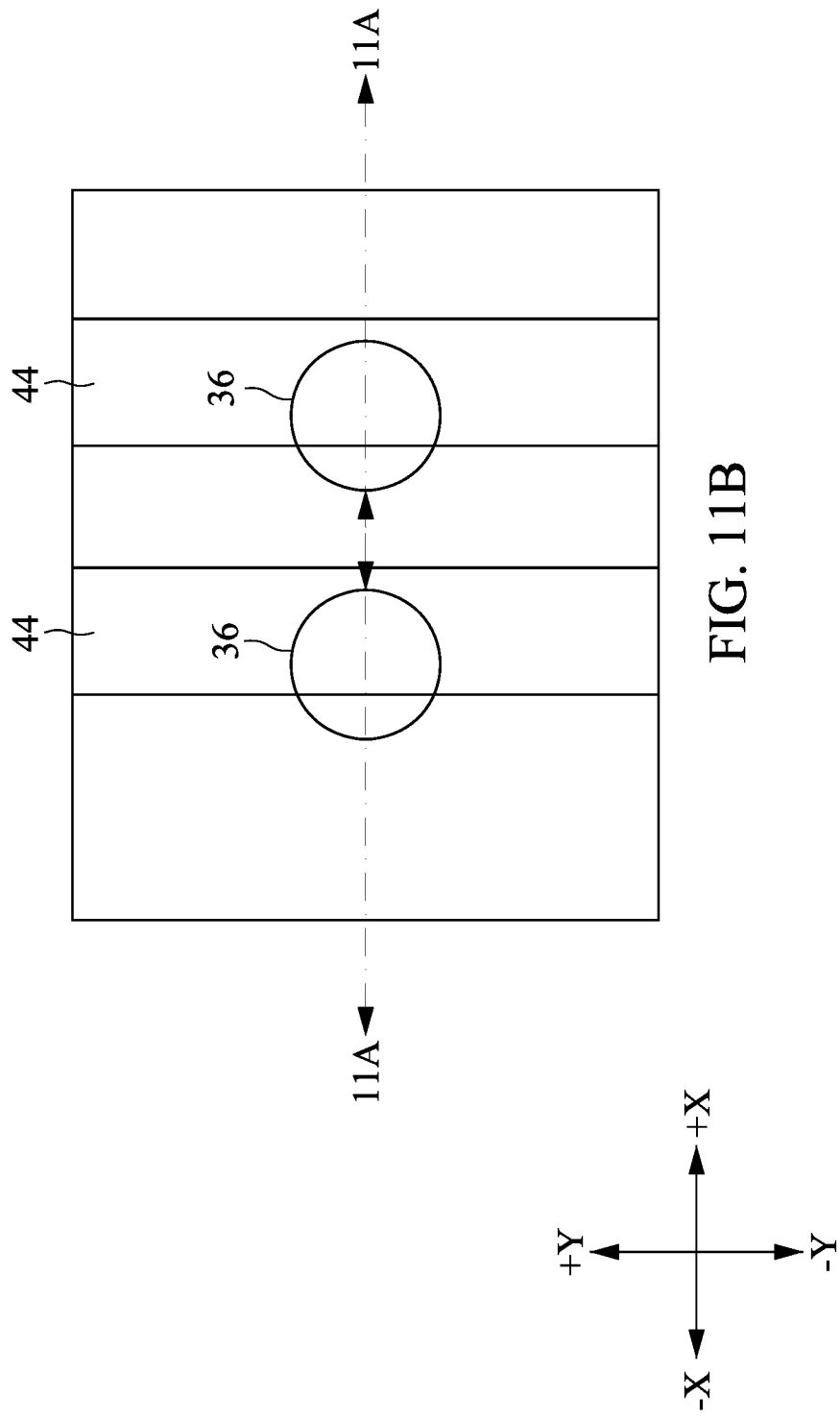

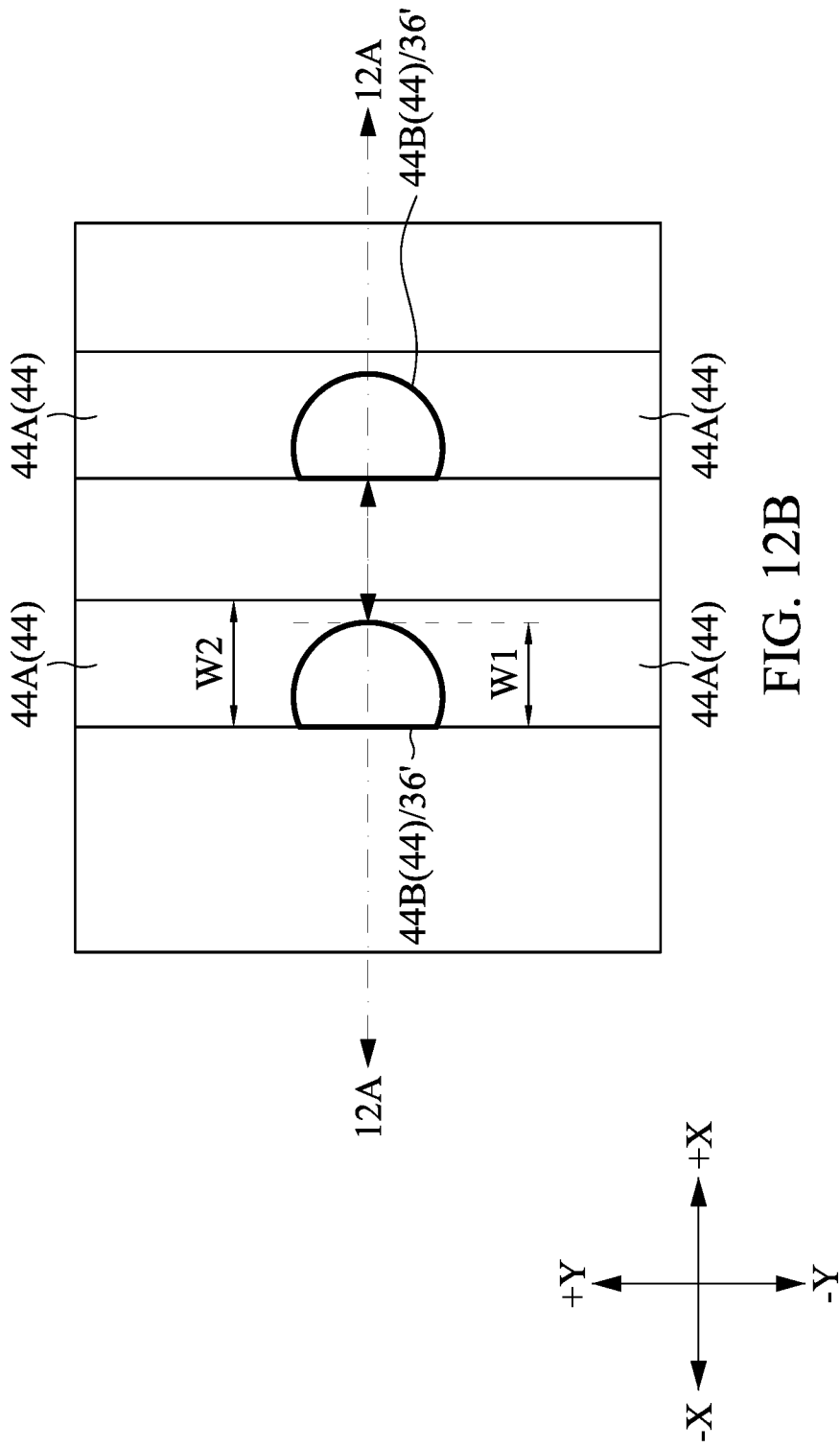

VIA-FIRST SELF-ALIGNED INTERCONNECT FORMATION PROCESS

PRIORITY CLAIM AND CROSS-REFERENCE

This application claims the benefit of the following provisionally filed U.S. Patent application: Application No. 63/188,205, filed on May 13, 2021, and entitled "Interconnect Structures with Self-Aligned Via and Method for Forming the Same;" which application is hereby incorporated herein by reference.

BACKGROUND

Interconnect structures, which include metal lines and vias, are used to interconnect the devices such as transistors as functional circuits. With the down-scaling of the sizes and the pitches of the metal lines and vias, the Critical Dimension (CD) uniformity control and overlay control of via patterning become more important and more difficult, especially when the pitches are smaller than about 40 nm. The reduction of the via sizes is limited due to optical effects. The CD uniformity is also strongly impacted by stochastic effect.

Conventionally, the formation of metal lines and vias include trench-first processes and via-first processes. In the trench-first processes, trench patterns are formed before the formation of via patterns. In the via-first processes, via patterns are formed before the formation of trench patterns. Both approaches suffer from problems. In the trench-first processes, the via-formation process window is limited due to the surface topography generated by trench patterns. The via-to-trench space window is also adversely affected by via overlay shift. In the via-first processes, the overlay shift of the trench patterns from the respective via patterns may cause the leakage between the resulting metal lines, which fill the trenches. Also, the residue of the bottom anti-reflective coating in the via holes may be difficult to remove, and may remain in the via holes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2A, 2B, 3, 4A, 4B, 5A, 5B, 6, 7A, 7B, 8, 9A, 9B, 10A, and 10B illustrate the cross-sectional views and top views of intermediate stages in the formation of an interconnect structure in accordance with some embodiments.

FIGS. 11A, 11B, 12A, 12B, 13A, and 13B illustrate the cross-sectional views and top views of intermediate stages in the formation of an interconnect structure in accordance with some embodiments.

DETAILED DESCRIPTION

Figure 1:
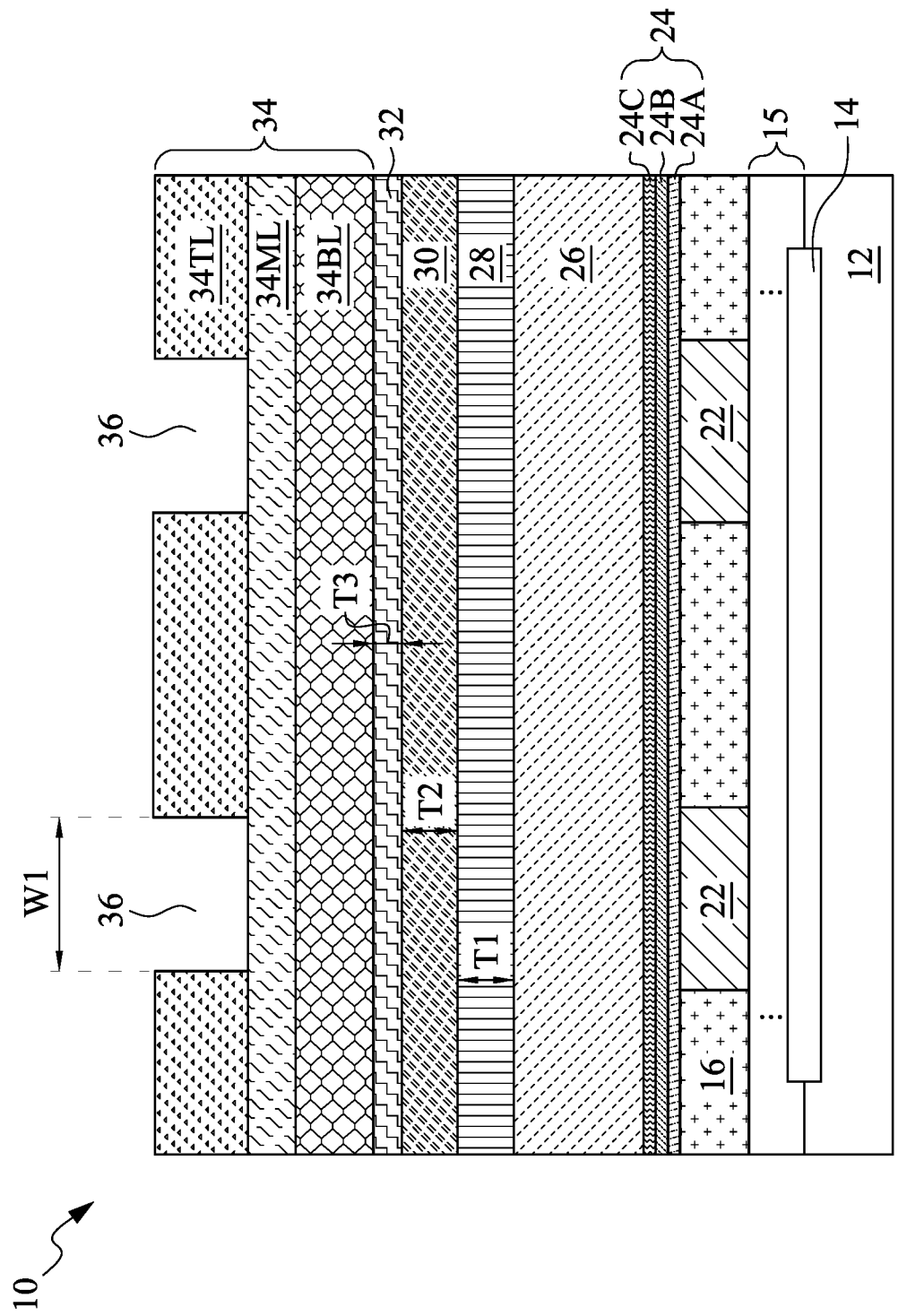

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure and the method of forming the same are provided. In accordance with some embodiments of the present disclosure, the interconnect structure is formed using a via-first process, in which a via pattern is formed in a first hard mask. A trench pattern is then formed in a second hard mask over the first hard mask. The via hole in an underlying dielectric layer is formed using both of the second hard mask and the first hard mask as the etching mask, so that the via hole is defined not only by the via pattern, but also is limited by the trench pattern. The resulting metal via is thus self-aligned to the respective overlying metal line. Accordingly, the distance between metal lines and the corresponding neighboring vias are maintained as being no greater than the distance between neighboring metal lines. Leakage is thus controlled, and possible bridging is eliminated. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1, 2A, 2B, 3, 4A, 4B, 5A, 5B, 6, 7A, 7B, 8, 9A, 9B, 10A, and 10B illustrate the cross-sectional views and top views of intermediate stages in the formation of an interconnect structure in accordance with some embodiments of the present disclosure. The corresponding processes are also reflected schematically in the process flow shown in FIG. 20.

FIG. 1 illustrates a cross-sectional view of package component 10. Package component may be a device wafer or an interposer wafer, and hence is referred to as wafer 10 in subsequent discussion, while package component 10 may also be of another type such as a reconstructed wafer (with device dies packaged therein), a package substrate, or the like. The illustrated portion may be a part of a device die when package component 10 is a device wafer. The corresponding package component 10 may include active devices such as transistors and/or diodes, and possibly passive devices such as capacitors, inductors, resistors, and/or the like.

In accordance with some embodiments of the present disclosure, wafer 10 includes semiconductor substrate 12 and the features formed at a top surface of semiconductor substrate 12. Semiconductor substrate 12 may be formed of crystalline semiconductor material such as silicon, germanium, silicon germanium, and/or a III-V compound semiconductor such as GaAsP, AlInAs, AlGaAs, GaInAs, GaInP, GaInAsP, or the like. Semiconductor substrate 12 may also be a bulk silicon substrate or a Silicon-On-Insulator (SOI) substrate. Shallow Trench Isolation (STI) regions (not shown) may be formed in semiconductor substrate 12 to isolate the active regions in semiconductor substrate 12. Although not shown, through-vias may be formed to extend into semiconductor substrate 12, wherein the through-vias are used to electrically inter-couple the features on opposite sides of semiconductor substrate 12. Integrated circuit devices 14, which may include active devices such as transistors and/or passive devices such as capacitors, resistors, or the like, may be formed at the top surface of semiconductor substrate 12.

Figure 20:
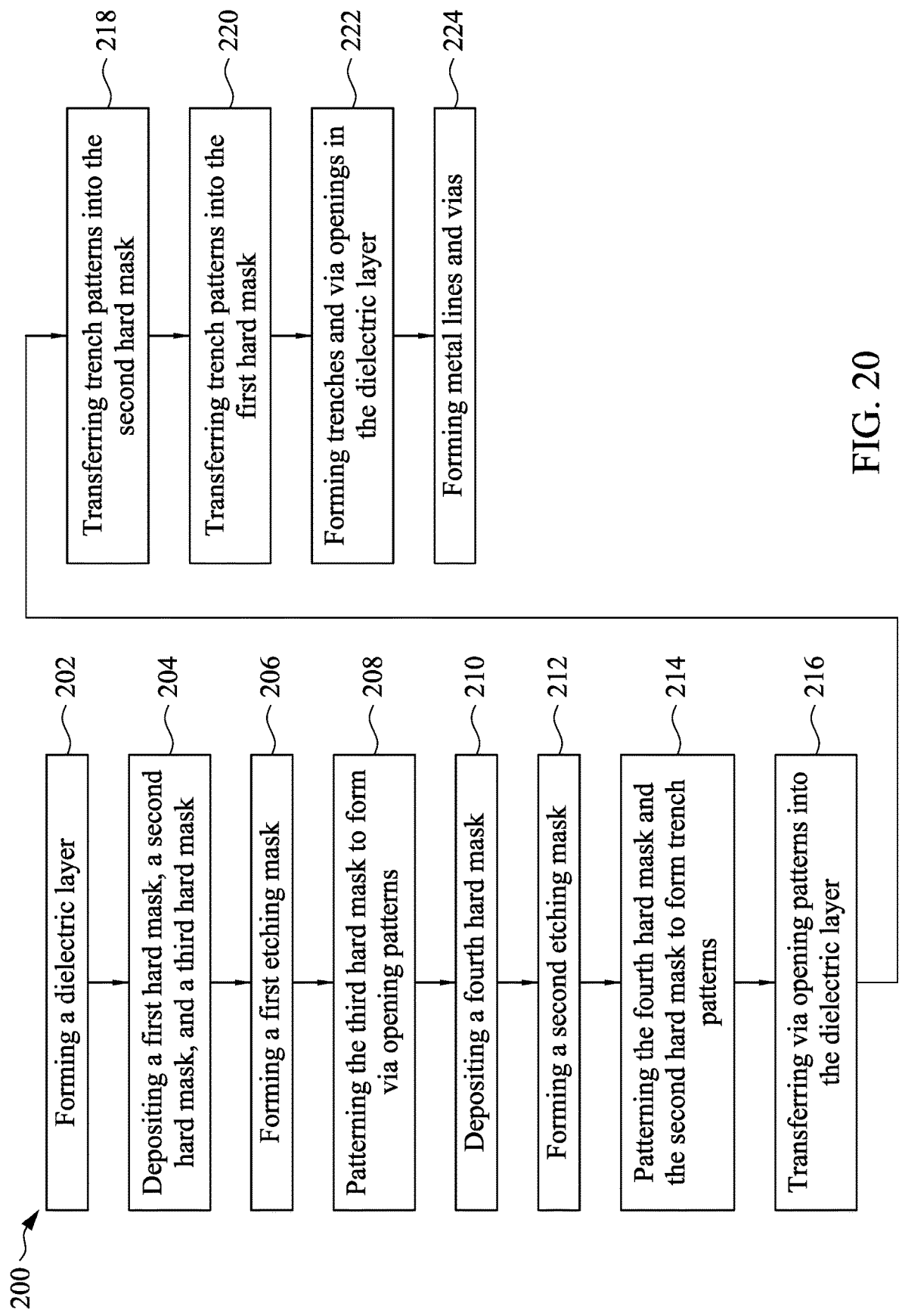
FIG. 20 illustrates a process flow for forming an interconnect structure in accordance with some embodiments.

Dielectric layer 16 is formed. The respective process is illustrated as process 202 in the process flow 200 as shown in FIG. 20. In accordance with some embodiments of the present disclosure, dielectric layer 16 is formed of a low-k dielectric material having a dielectric constant (k-value) lower than about 3.5, lower than about 3.0, or even lower. Dielectric layer 16 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of dielectric layer 16 includes depositing a porogen-containing dielectric material, and then performing a curing process to drive out the porogen, and hence the remaining IMD layer 16 is porous.

Conductive features 22 are formed in IMD 16. In accordance with some embodiments, each of conductive features 22 includes at least a diffusion barrier layer and a copper-containing or tungsten-containing material over the diffusion barrier layer. The diffusion barrier layer may be formed of titanium, titanium nitride, tantalum, tantalum nitride, or the like, and has the function of preventing copper in copper-containing material from diffusing into IMD 16. Alternatively, conductive features 22 may be barrier-less, and may be formed of cobalt, tungsten, ruthenium, or the like. Conductive features 22 may have a single damascene structure or a dual damascene structure. Conductive features 22 may be formed through a direct metal etching process. Dielectric layer 16 is covered after the conductive forming.

In accordance with some embodiment, dielectric layer 16 is an Inter-Metal Dielectric (IMD) layer, and conductive features 22 are metal lines and/or vias. In accordance with alternative embodiments, dielectric layer 16 is an inter-layer dielectric layer, and conductive features 22 are contact plugs. There may be, or may not be, additional features between dielectric layer 16 and devices 14, and the additional features are represented as structure 15, which may include dielectric layers such as a contact etch stop layer, an inter-layer dielectric, etch stop layers, and IMDs. Structure 15 may also include contact plugs, vias, metal lines, etc.

Dielectric layer 24 is deposited over dielectric layer 16 and conductive lines 22. Dielectric layer 24 may be used as an Etch Stop Layer (ESL), and hence is referred to as etch stop layer or ESL 24 throughout the description. Etch stop layer 24 may include a nitride, a silicon-carbon based material, a carbon-doped oxide, an oxygen-doped carbide, a metal-containing dielectric, or the like. For example, the materials of ESL 24 may include SiCN, SiOCN, SiOC, $AlO_x$, AlN, AlCN, or the like, or combinations thereof. ESL 24 may be a single layer formed of a homogeneous material, or a composite layer including a plurality of dielectric sub-layers such as sub-layers 24A, 24B, and 24C. In accordance with some embodiments of the present disclosure, ESL 24 includes an aluminum nitride (AlN) layer, a SiOC layer over the AlN layer, and an aluminum oxide ($AlO_x$) layer over the SiOC layer.

Dielectric layer 26 is deposited over ESL 24. In accordance with some exemplary embodiments of the present disclosure, dielectric layer 26 is formed of a silicon-containing dielectric material such as silicon oxide. Dielectric layer 26 may be formed of a low-k dielectric material, and hence is referred to as low-k dielectric layer 26 hereinafter. Low-k dielectric layer 26 may be formed using a material selected from the same group of candidate materials for forming dielectric layer 16, or a material different from that of dielectric layer 16. When selected from the same group of candidate materials, the materials of dielectric layers 16 and 24 may be the same or different from each other.

A first hard mask 28, a second hard mask 30, and a third hard mask 32 are sequentially deposited over dielectric layer 26. The respective process is illustrated as process 204 in the process flow 200 as shown in FIG. 20. Hard masks 28, 30, and 32 may be deposited using Plasma Enhanced Chemical Vapor Deposition (PECVD), Atomic Layer Deposition (ALD), Chemical Vapor Deposition (CVD), or the like. In accordance with some embodiments, thickness T1 of hard mask 28 is in the range between about 1 nm and about 100 nm, thickness T2 of hard mask 30 is in the range between about 10 nm and about 200 nm, and thickness T3 of hard mask 32 is in the range between about 1 nm and about 100 nm.

In accordance with some embodiments, the candidate materials of hard mask 28 may include $AlO_x$, $SiO_x$, SiN, SiOC, SiON, SiOCN, TiN, $TiO_x$, or the like, or combinations thereof. Hard mask 30 is formed of a material different from the material of hard mask 28, so that etching selectivity ER30/ER28 in the subsequent etching of hard mask 30 may be greater than 1, for example, greater than about 5, 10, or higher, wherein etching selectivity ER30/ER28 is the ratio of the etching rate ER30 of hard mask 30 to the etching rate ER28 of hard mask 28. It is appreciated that the etching selectivity ER30/ER28 is related to the materials of hard mask 28 and hard mask 30, and is also related to the etching chemical used for the etching process. A greater etching selectivity may be resulted from a greater material difference between the materials of hard mask 28 and hard mask 30. In accordance with some embodiments, hard mask 30 is formed of $AlO_x$, $SiO_x$, SiN, SiOC, SiON, SiOCN, TiN, TiO, BN, AlN, or the like, or combinations thereof.

Hard mask 32 may be formed of a material different from the materials of both of hard masks 30 and 28. Both of etching selectivity values ER32/ER30 (in the etching of hard mask 32) and ER32/ER28 (in the etching of hard mask 32) may be greater than 1, wherein ER32 is the etching rate of hard mask 32. The etching selectivity values may also be greater than about 5, 10, or higher. In accordance with some embodiments, hard mask 32 is formed of a material selected from AlN, AlO$_x$, SiO$_x$, SiN, SiOC, SiON, SiOCN, or the like, or combinations thereof.

Further referring to FIG. 1, an etching mask 34, which may be a tri-layer, is formed. The respective process is illustrated as process 206 in the process flow 200 as shown in FIG. 20. Etching mask 34 may include bottom layer (also sometimes referred to as an under layer) 34BL, middle layer 34ML over bottom layer 34BL, and top layer (also sometimes referred to as an upper layer) 34TL over middle layer 34ML. Under layer 34BL, middle layer 34ML, and top layer 34TL may also be referred to as a Bottom Anti-Reflective Coating (BARC), an intermediate mask layer, and a top photoresist layer, respectively. In accordance with some embodiments, bottom layer 34BL is formed of a carbon-containing material (through CVD), and top layer 34TL is formed of a photo resists (through spin coating), which may include organic or inorganic materials. Top layer 34TL is formed with the bottom layer 34BL being crystallized or cross-linked already. Middle layer 34ML may be formed of a mixed inorganic silicon-containing material, which may be a nitride (such as silicon nitride), an oxynitride (such as silicon oxynitride), an oxide (such as silicon oxide), or the like. Middle layer 34ML may also be an inorganic film (such as silicon) deposited through CVD. Middle layer 34ML has a high etching selectivity with relative to top layer 34TL and bottom layer 34BL, and hence top layer 34TL may be used as an etching mask for patterning middle layer 34ML, and middle layer 34ML may be used as an etching mask for patterning bottom layer 34BL. In accordance with some embodiments, middle layer 34ML are may be omitted when etching selectivity of 34BL to 34TL is enough for patterning. Top layer 34TL is patterned to form openings 36, which are used to define via openings in hard mask 32.

Hard masks 28, 30, and 32 may be formed as fully planar layers across the entire wafer 10, so that the focus window of the subsequent lithography process may be reduced. In accordance with some embodiments, the lateral dimensions (widths) W1 of openings 36 may be in the range between about 15 nm and about 40 nm. In accordance with some embodiments, openings 36 are circles when viewed from top. In accordance with alternative embodiments, openings 36 may have other top-view shapes such as rectangles, rectangles with rounded corners, ovals, or the like.

In a subsequent process, the patterns of etching mask 34 are transferred into the underlying hard mask 32. The respective process is illustrated as process 208 in the process flow 200 as shown in FIG. 20. First, middle layer 34ML is etched using the patterned top layer 34TL as an etching mask, so that the openings 36 extend into middle layer 34ML. After middle layer 34ML is etched-through, bottom layer 34BL is further patterned, during which middle layer 34ML is used as an etching mask. During the patterning of bottom layer 34BL, top layer 34TL is consumed. Middle layer 34ML may be partially or fully consumed during the patterning of bottom layer 34BL. In the patterning of bottom layer 34BL, openings 36 extend downwardly, revealing the underlying hard mask 32.

Figure 2A:
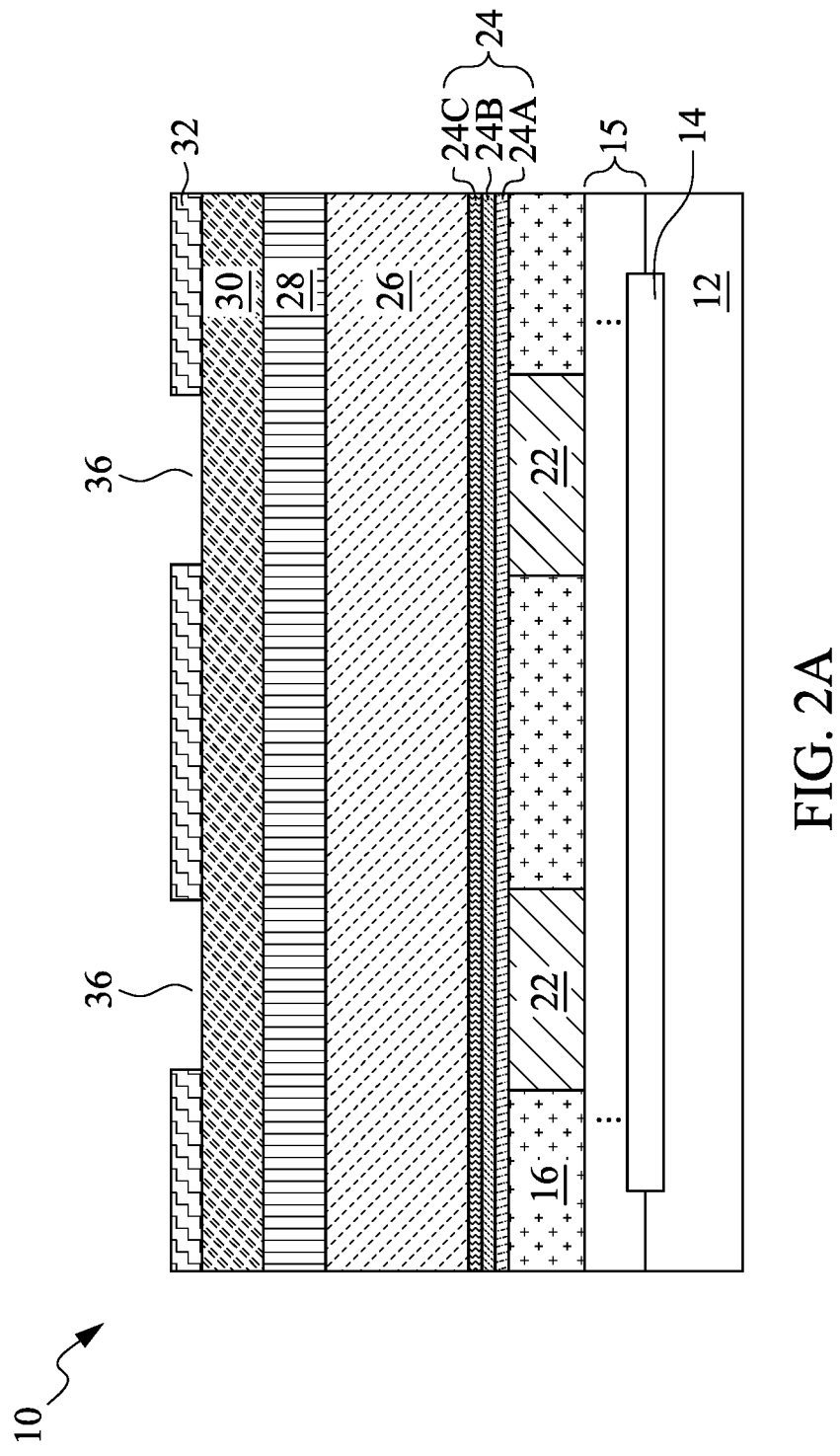
Figure 2B:
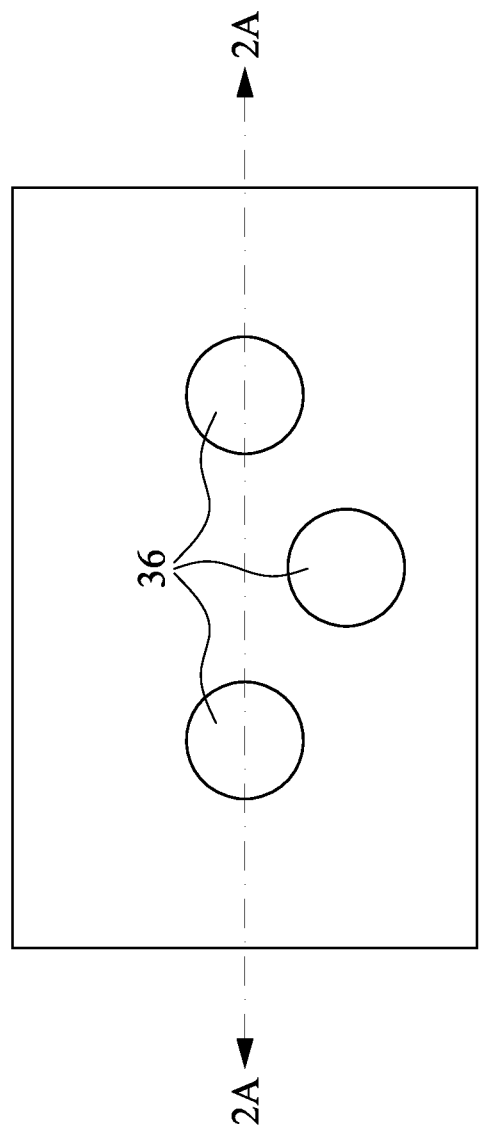

Next, hard mask 32 is patterned through etching, with bottom layer 34BL (and middle layer 34ML if it has not been fully consumed yet) being used as an etching mask. The patterning of hard mask 32 stops on hard mask 30, which acts as an etch stop layer. Openings 36 thus extend into hard mask 32. The portions of the openings 36 in hard mask 32 are also referred to as first (via) openings hereinafter. After the patterning of hard mask 32, the remaining portions of bottom layer 34BL are removed. The resulting structure is shown in FIGS. 2A and 2B. FIG. 2B illustrates a top view of the structure shown in FIG. 2A, wherein the cross-sectional view shown in FIG. 2A is obtained from reference cross-section 2A-2A in FIG. 2B.

Figure 3:
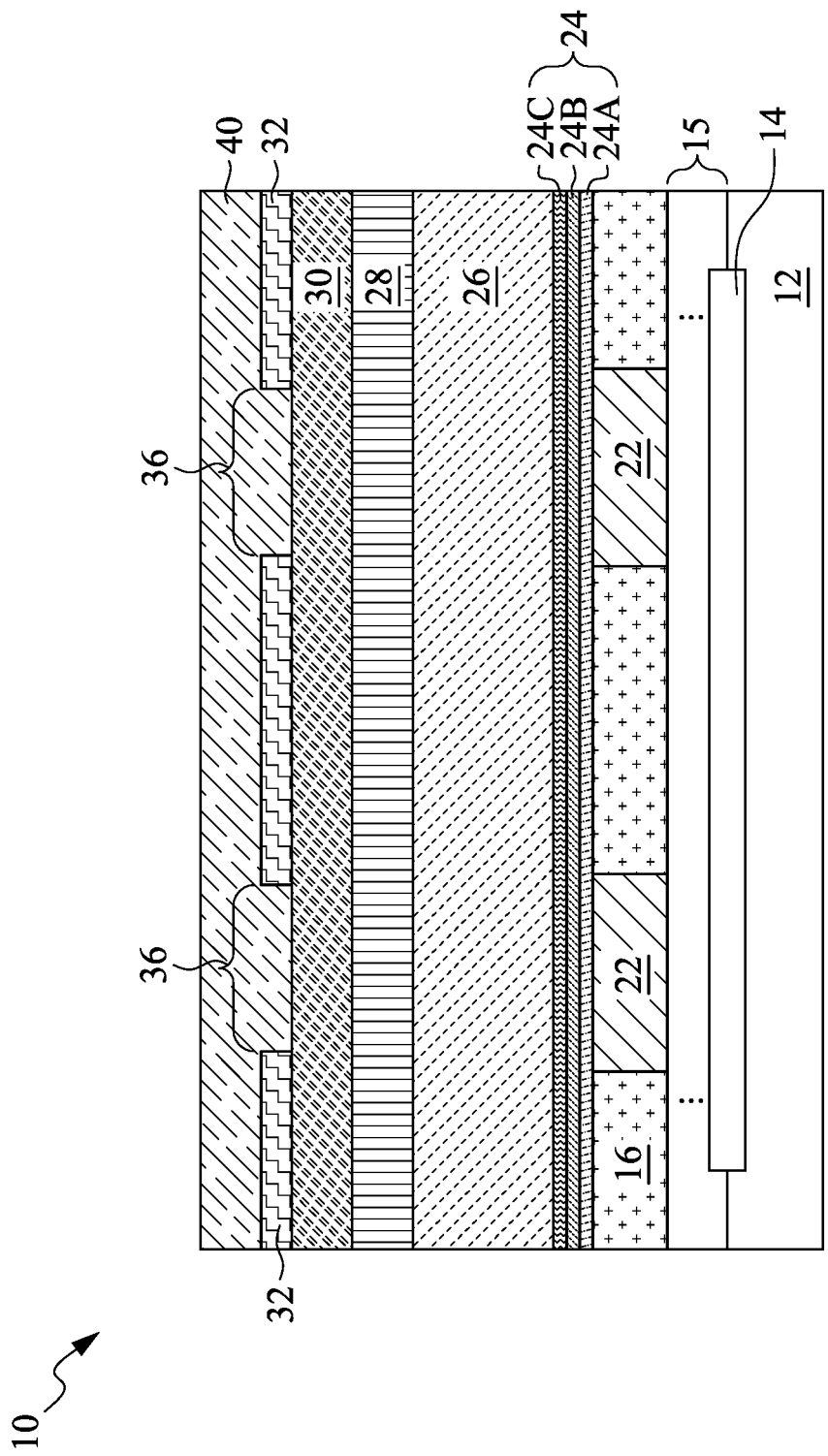

Referring to FIG. 3, a fourth hard mask 40 is deposited. The respective process is illustrated as process 210 in the process flow 200 as shown in FIG. 20. Hard mask 40 is formed of a material different from that of hard mask 32, so that the etching selectivity ER40/ER32 is greater than 1.0, and may be greater than about 5, 10, or higher in the subsequent etching process for forming trenches. Furthermore, hard mask 40 may be formed of or comprises a material same as, or different from, the material of hard mask 28. In accordance with some embodiments, hard mask 40 is formed of or comprises AlN, AlO$_x$, SiO$_x$, SiN, SiOC, SiON, SiOCN, TiN, TiO or the like, or combinations thereof.

Figure 4A:
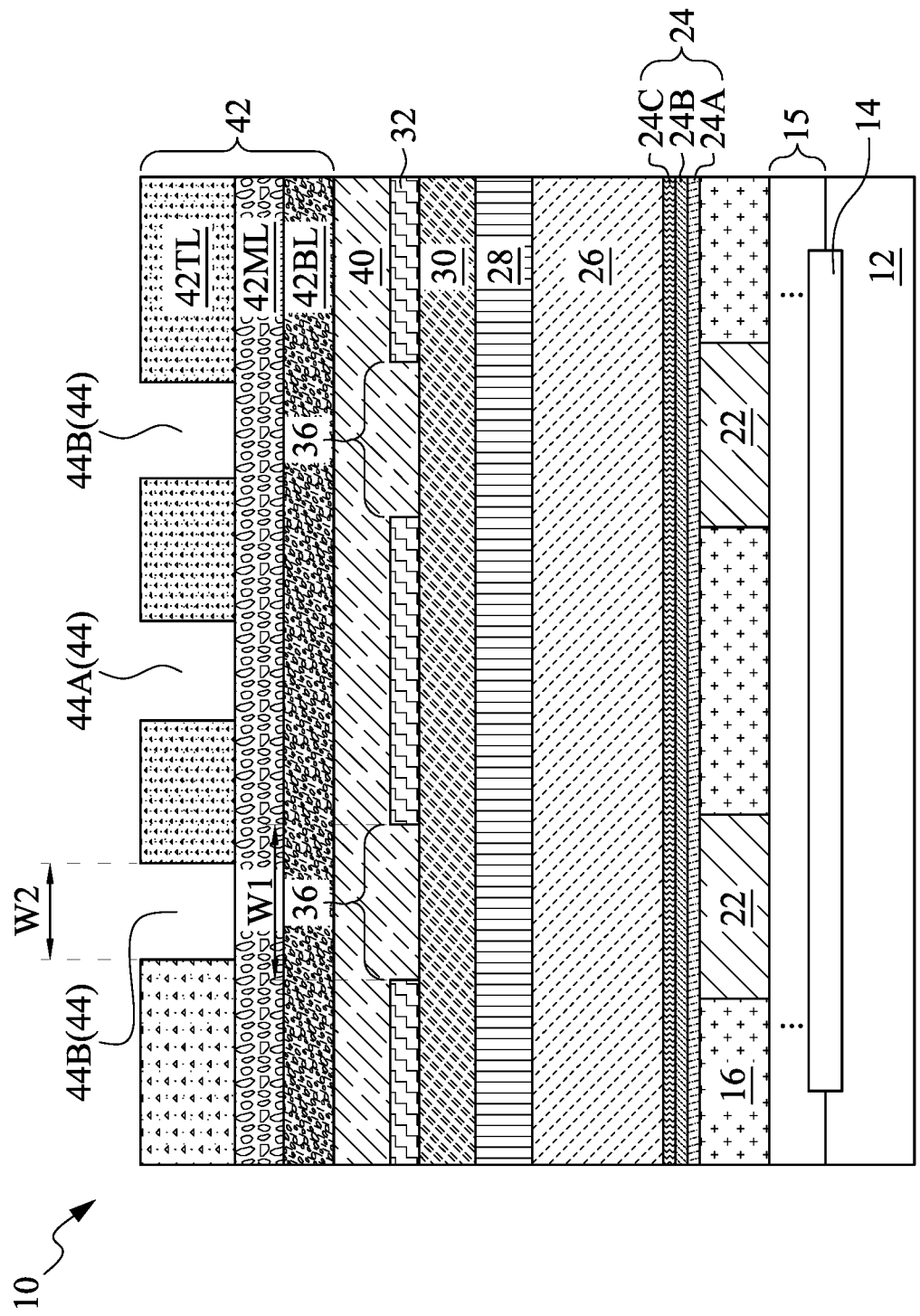

Referring to FIG. 4A, etching mask 42, which may be a tri-layer, is formed. The respective process is illustrated as process 212 in the process flow 200 as shown in FIG. 20. Etching mask 42 may include bottom layer 42BL, middle layer 42ML over bottom layer 42BL, and top layer 42TL over middle layer 42ML. The materials of bottom layer 42BL, middle layer 42ML, and top layer 42TL may be selected from the same group of candidate materials for forming bottom layer 34BL, middle layer 34ML, and top layer 34TL, respectively. Top layer 42TL is patterned to form trenches 44 (including portions 44A and 44B), which are used to define trenches in hard mask 40. In accordance with some embodiments, the lateral dimensions (widths) W2 of trenches 44 are smaller than the dimensions (widths) W1 of via openings 36 in hard mask 32. For example, ratio W2/W1 may be in the range between about 0.7 and about 0.9. Widths W2 may be smaller than about 36 nm, or may be in the range between about 13 nm and about 30 nm.

Figure 4B:
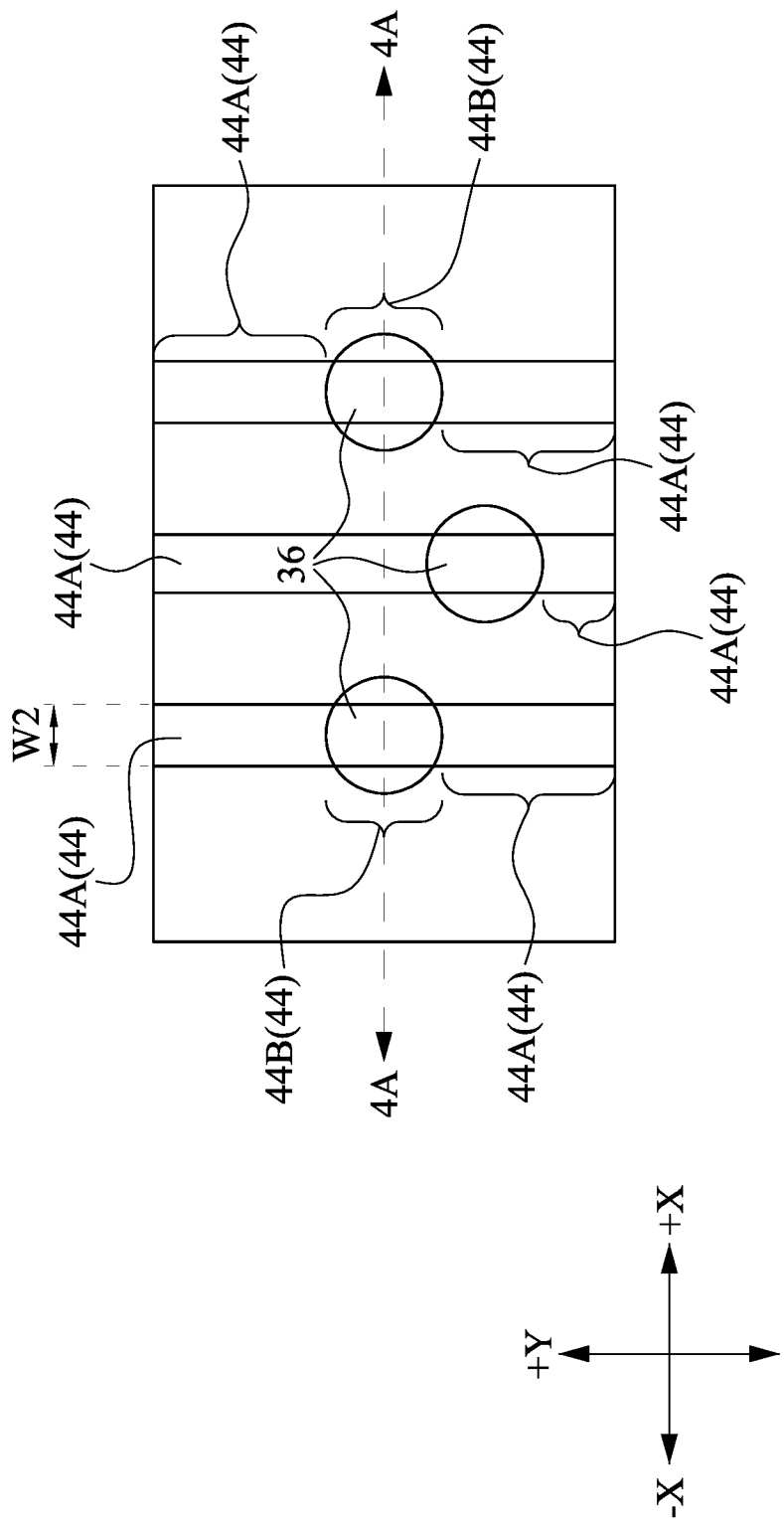

FIG. 4B illustrates a top view of the structure shown in FIG. 4A, wherein the cross-sectional view shown in FIG. 4A is obtained from reference cross-section 4A-4A in FIG. 4B. In the top view, via openings 36 may extend laterally beyond the boundaries of in one or both of +X direction and −X direction. A part of each of via openings 36 is directly underlying the corresponding trenches 44, and via openings 36 also include some portions extending laterally beyond the opposing straight edges of trenches 44. As shown in FIGS. 4A and 4B, trenches 44 include trench portions 44B and 44A. Trench portions 44B are directly over via openings 36. Trench portions 44A overlap hard mask 32, and are vertically offset from via openings 36.

In a subsequent process, the patterns of etching mask 42 are transferred into the underlying hard mask 40. The respective process is illustrated as process 214 in the process flow 200 as shown in FIG. 20. The patterning includes transferring the patterns in top layer 42TL to middle layer 42ML and bottom layer 42BL, which are then used as etching masks to etch hard mask 40, and to extend trenches 44 downwardly.

Figure 5A:
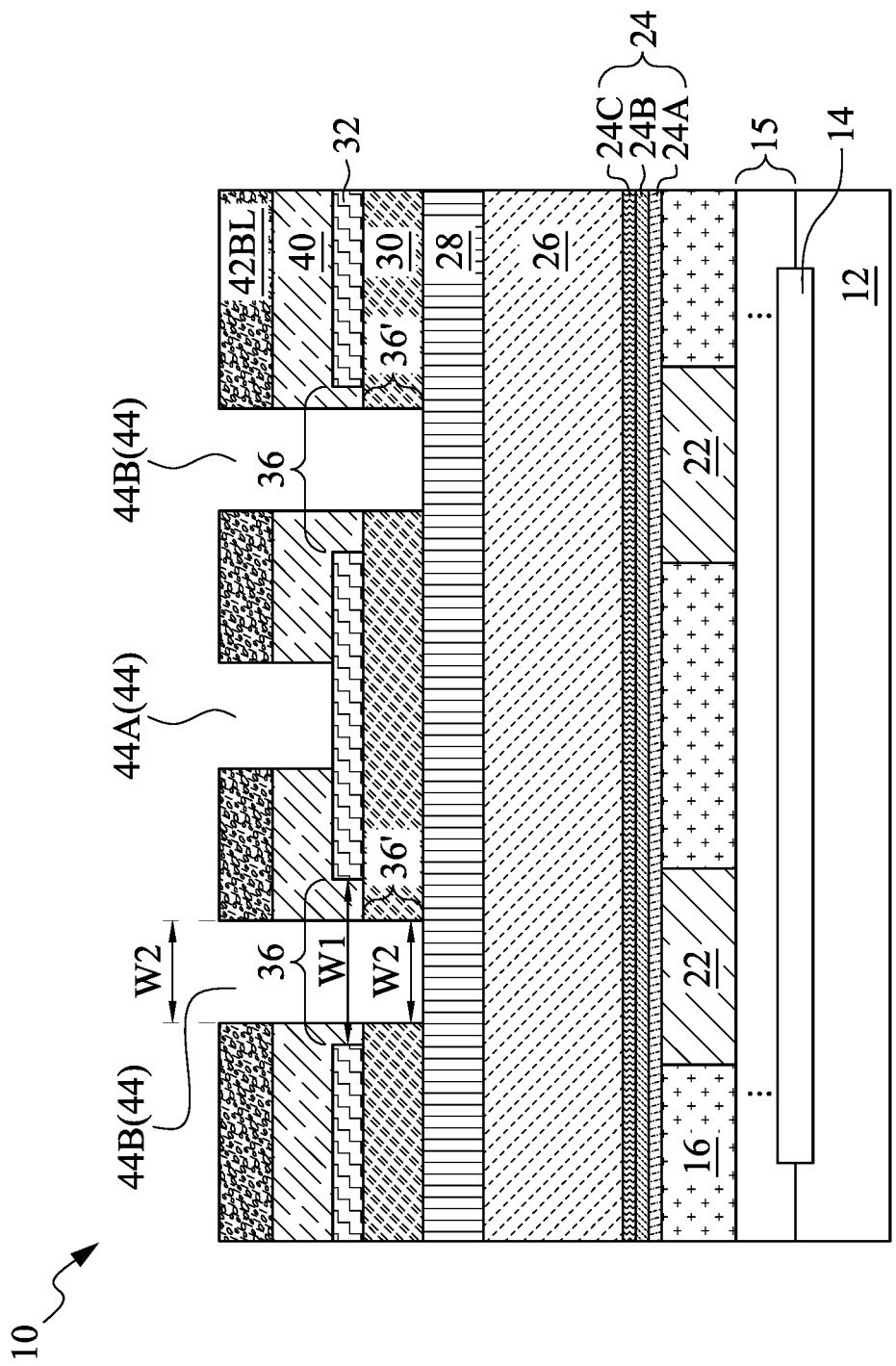

Referring to FIG. 5A, the downward extension of trench portions 44A is stopped on hard mask 32. The downward extending of trench portions 44B, on the other hand, is not stopped since there is no hard mask 32 directly below. Accordingly, trench portions 44B penetrate through hard mask 40 to reach hard mask 30, which is then etched, so that trenches 44 join via openings 36 to form new narrowed via openings 36' in hard mask 30. Via openings 36' are also referred to as second via openings 36'. The etching of hard mask 30 is stopped on hard mask 28. The etching process as shown in FIG. 5A may be achieved by selecting the proper etching gas that attacks both of hard masks 40 and 30, but does not attack hard masks 32 and 28.

FIG. 5B illustrates a top view of the structure shown in FIG. 5A, wherein the cross-sectional view shown in FIG. 5A is obtained from reference cross-section 5A-5A in FIG. 5B. Referring to FIGS. 5A and 5B, since hard mask 32 acts as an etching mask for the etching of hard masks 40 and 30, via openings 36' are formed where via openings 36 are formed in hard mask 32, and are not formed where hard mask 32 exists. Accordingly, in the formation of via openings 36, etching mask 40 and hard mask 32 are in combination used as the etching mask for defining the position and the sizes of via openings 36'. Via openings 36' are thus self-aligned to the trenches 44 because via openings 36' are directly underlying trenches 44, and are not formed wherein there is no trenches 44 formed. Accordingly, the width W2 of via openings 36' is smaller than the width W1 of opening 36, and is equal to (within process variation) width W2 of trenches 44. As shown in FIG. 5B, the left edges and right edges (parallel to Y-directions) of via openings 36' are defined by the edges of trenches 44, and hence may be straight, while the other two edges are not limited by trenches 44, and may be curved. After the patterning of hard mask 40, the remaining portions of bottom layer 42BL are removed.

Figure 6:
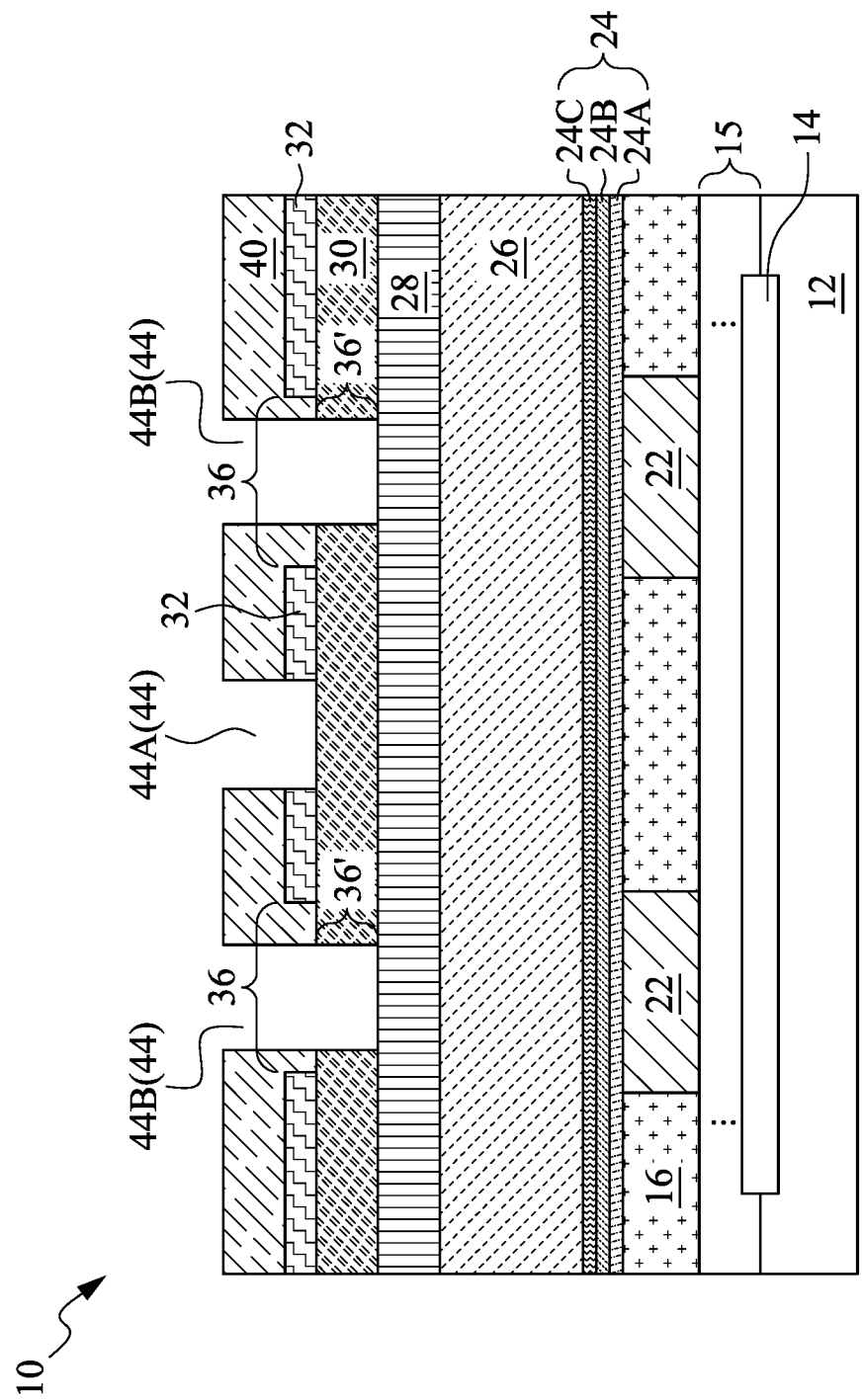

Next, as shown in FIG. 6, an etching process is performed to etch hard mask 32, so that trench portions 44A penetrate through hard mask 32, and are stopped on hard mask 30. The respective process is also illustrated as process 214 in the process flow 200 as shown in FIG. 20.

Figure 7A:
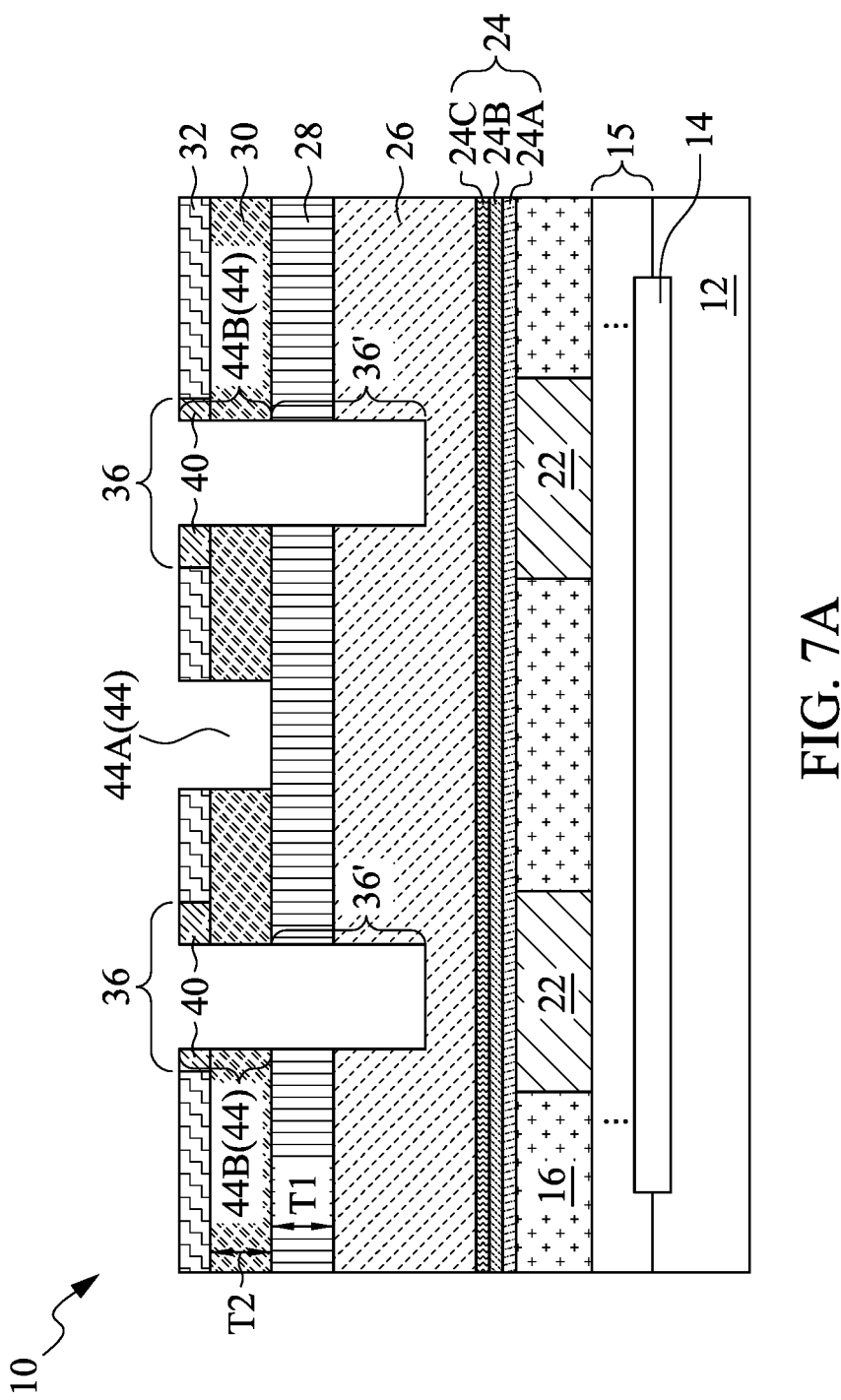
Figure 7B:
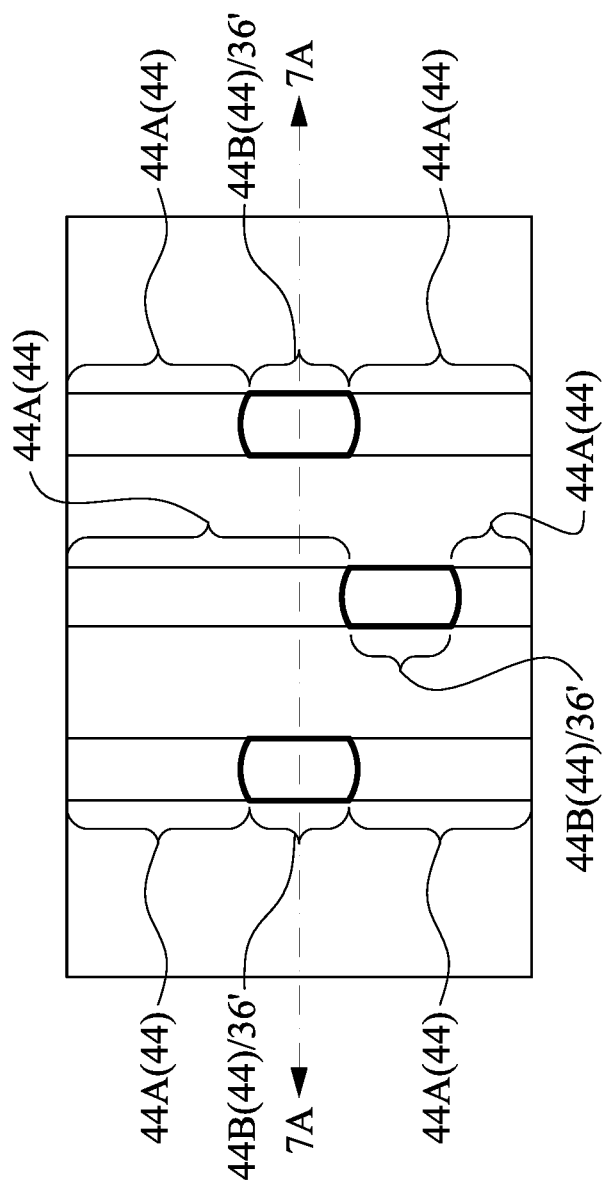

FIG. 7A illustrates the downward extension of via openings 36' into hard mask 28 and dielectric layer 26, and the downward extension of trench portions 44A into hard mask 30. In accordance with some embodiments, the downward extension of via openings 36' and trench portions 44A is performed through a two-step etching processes, wherein different etching gases are used in the two steps. In the first step, via openings 36' are extended down, which includes etching-through hard mask 28, followed by the etching of dielectric layer 26, so that via openings 36' stop at an intermediate level between the top surface and the bottom surface of dielectric layer 26. The respective process is illustrated as process 216 in the process flow 200 as shown in FIG. 20. The etching of hard mask 28 and dielectric layer 26 may be achieved using a same etching gas or different etching gases. In the first etching step, hard mask 30 is not etched, so that trench portions 44A remain to stop on hard mask 30. In the second etching step, another etching gas is selected to etch-through hard mask 30, while hard mask 28 and dielectric layers 26 are not etched. The respective process is illustrated as process 218 in the process flow 200 as shown in FIG. 20. Accordingly, the second etching step results in trench portions 44A to stop on hard mask 28. Via openings 36', on the other hand, remain unchanged in depth during the second etching process. FIG. 7B illustrates a top view of the structure shown in FIG. 7A, wherein the cross-sectional view shown in FIG. 7A is obtained from reference cross-section 7A-7A in FIG. 7B. It is appreciated that the discussed processes for forming the structures in FIGS. 7A and 7B are examples, and there are other processes for forming the structures shown in FIGS. 7A and 7B, which processes are also in the scope of the present disclosure.

In accordance with alternative embodiments, instead of using two-step etching processes to downwardly extend via openings 36' and trench portions 44A, a single-step etching process may be used. In accordance with these embodiments, the thickness T1 of hard mask 28 is relatively small compared to thickness T2 of hard mask 30, for example, with ratio T1/T2 being smaller than about 1. Also, the etching selectivity ER30/ER28 is relatively small, for example, with etching selectivity ER30/ER28 being smaller than about 5, or may be in the range between about 0.3 and about 3. The net result is that both of hard masks 30 and 28 are etched at the same time, and the portions of hard mask 28 directly underlying trench portions 44B are etched-through first since hard mask 28 is thin. Dielectric layer 26 is then etched. When via openings 36' reach a desirable depth in dielectric layer 26, there are still a portion of hard masks 30 and 28 directly underlying trench portions 44A to protect the underlying dielectric layer 26.

Figure 8:
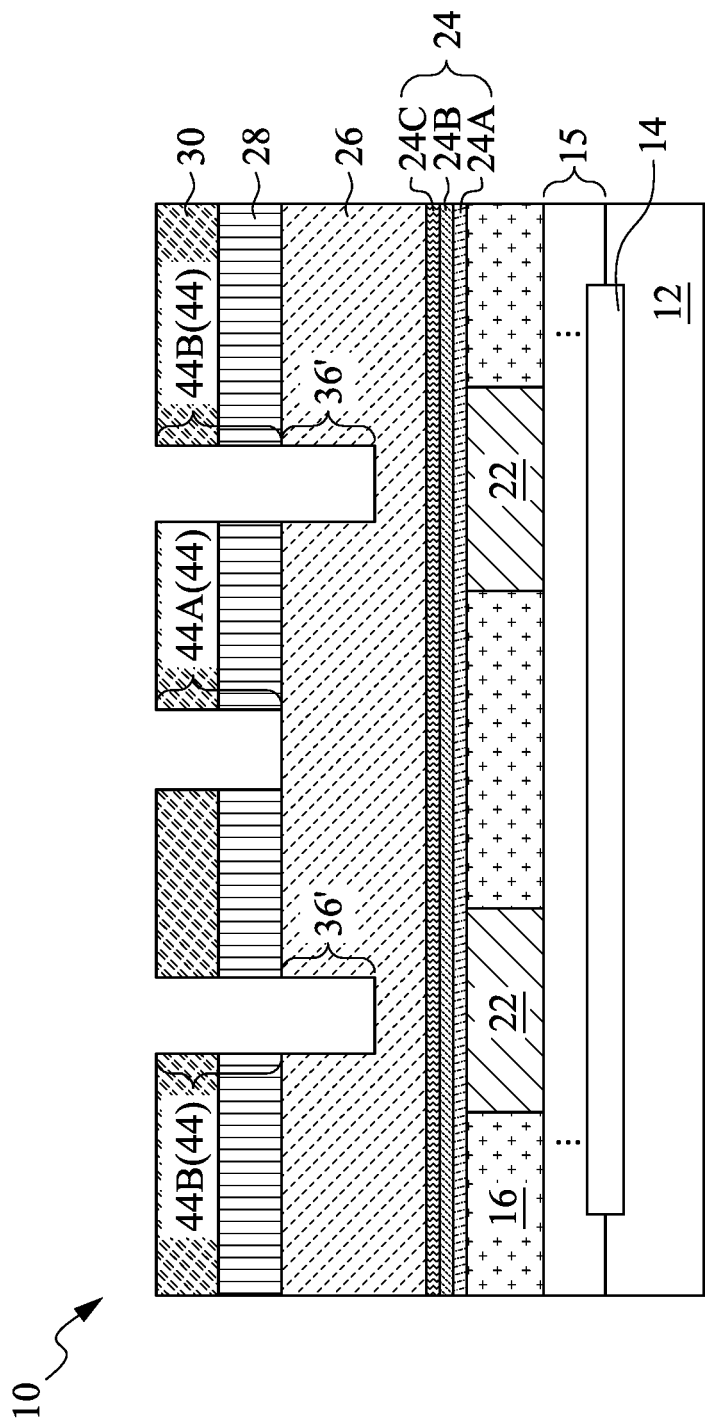

Next, referring to FIG. 8, the patterns of trench portions 44A and 44B are transferred into hard mask 28 through etching. The etching is performed using the combination of hard masks 32 and 40 as the etching mask. The respective process is also illustrated as process 220 in the process flow 200 as shown in FIG. 20.

Figure 9A:
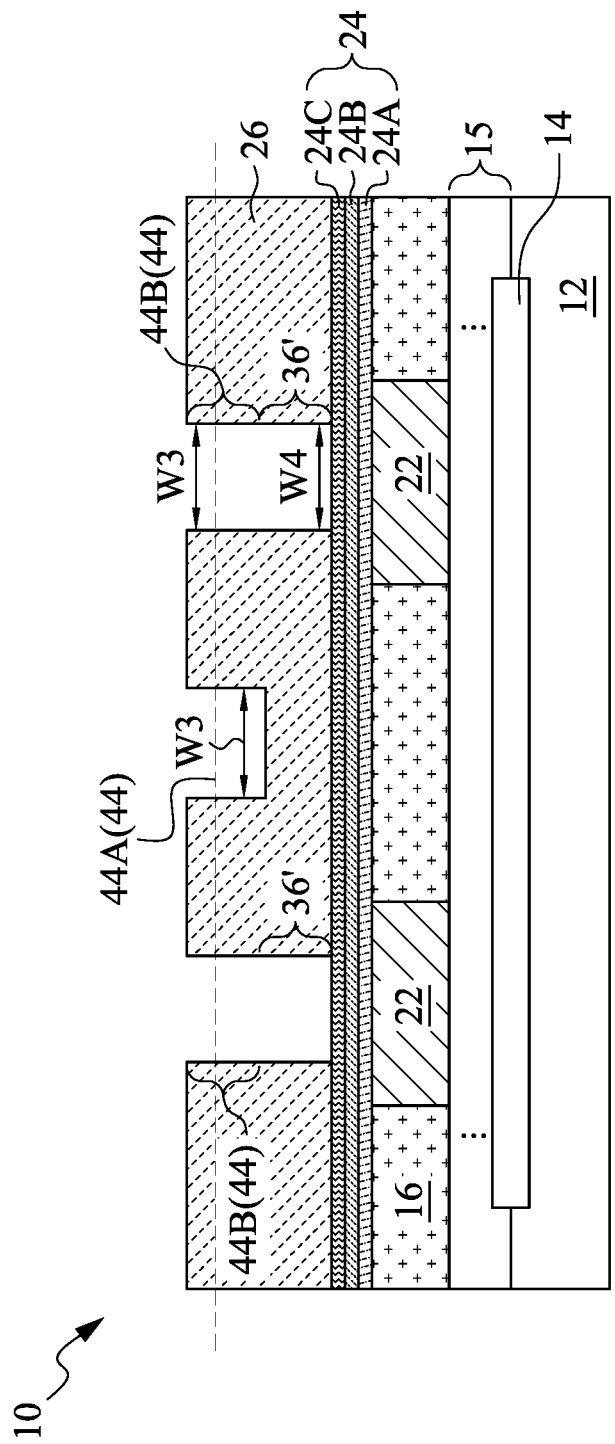
Figure 9B:
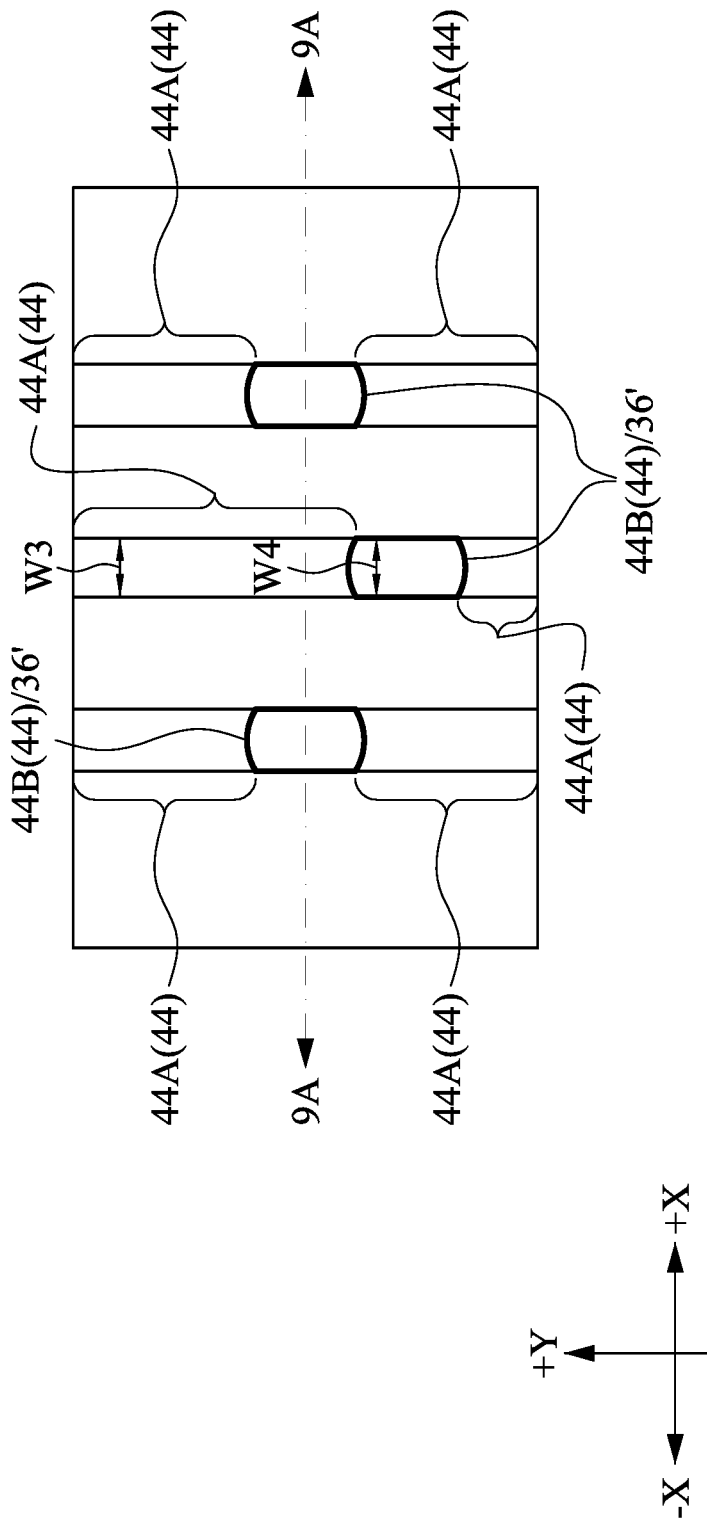

FIGS. 9A and 9B illustrate a cross-sectional view and a top view, respectively, in the transferring of trench portions 44A and 44B in dielectric layer 26. The transferring of trenches 44 is performed by etching dielectric layer 26 using hard mask 28 (and hard mask 30 if it remains, shown in FIG. 8) as an etching mask. The bottoms of trenches 44 are at an intermediate level between the top surface and the bottom surface of dielectric layer 26. In accordance with some embodiments, the etching of dielectric layer 26 is performed using an etching gas selected from $C_4F_6$, $C_4F_8$, $C_5F_8$, $CF_4$, $CHF_3$, $CH_2F_2$, $NF_3$, $N_2$, $O_2$, Ar, He, and combinations thereof. At the same time trenches 44 are formed, via openings 36' extend to the bottom of dielectric layer 26, and etch stop layer 24 is revealed. The respective process is illustrated as process 222 in the process flow 200 as shown in FIG. 20.

Next, etch stop layer 24 is removed in an etching process, which may include a dry etching process and/or a wet etching process. Conductive features 22 are thus exposed to via openings 36'.

FIG. 9B illustrates a top view of the structure shown in FIG. 9A. The cross-sectional view shown in FIG. 9A is obtained from the reference cross-section 9A-9A in FIG. 9B. It is appreciated that the trenches 44 include portions 44A vertically offset from via openings 36', and portions 44B directly over via openings 36'. Also, the width W3 of trench portions 44A and 44B is equal to (within process variation) the width W4 of via openings 36'.

Figure 10A:
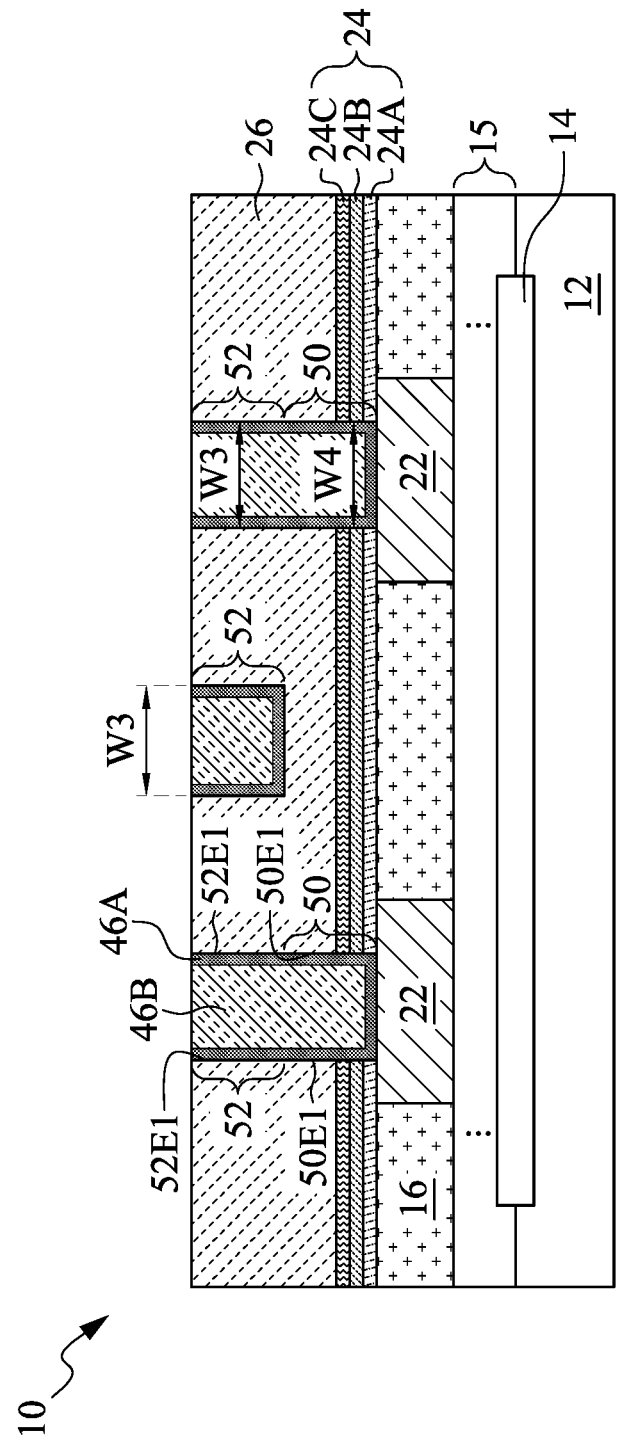
Figure 10B:
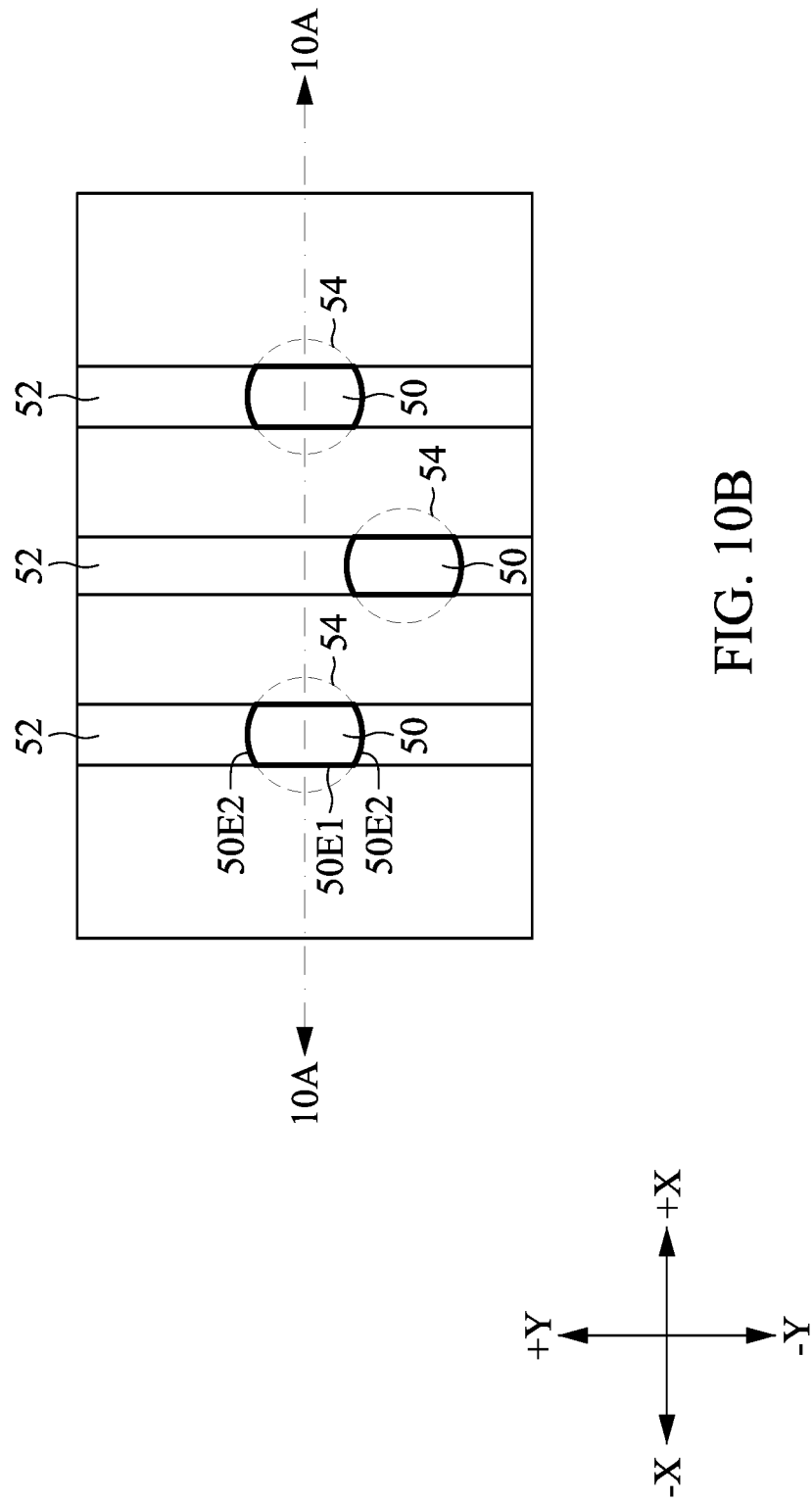

FIGS. 10A and 10B illustrate the formation of conductive materials filling via openings 36' and trenches 44 to form vias 50 and metal lines 52. The respective process is illustrated as process 224 in the process flow 200 as shown in FIG. 20. FIG. 10B illustrates a top view of the structure shown in FIG. 10A. The cross-sectional view shown in FIG. 10A is obtained from the reference cross-section 10A-10A in FIG. 10B. In accordance with some embodiments, a metallic material such as cobalt, tungsten, ruthenium, or the like, or combinations thereof, is deposited. The deposition may be performed using a barrier-less process, wherein no barrier is formed, and the metallic material is in contact with conductive features 22 and dielectric layer 26. In accordance with alternative embodiments, the conductive material may include at least a diffusion barrier 46A and a metallic material 46B on the diffusion barrier. The diffusion barrier 46A may be formed of titanium, titanium nitride, tantalum, tantalum nitride, or the like. The metallic material 46B may be formed of or comprise copper, while other materials such as tungsten, cobalt, ruthenium, or the like may also be used.

In a subsequent process, a planarization process such as a CMP process or a mechanical polishing process is performed to remove excess conductive materials over dielectric layer 26. The planarization process may be performed until dielectric layer 26 is revealed. Vias 50 and metal lines 52 are thus formed.

As shown in FIGS. 10A and 10B, vias 50 are self-aligned to metal lines 52, with the widths W4 and the edges (parallel to the Y-direction) of vias 50 being confined by the edges (parallel to the Y-direction) of metal lines 52. In accordance with some embodiments, metal lines 52 include straight edges 52E1, and the straight edges 50E1 of vias 50 are vertically aligned to the straight edges 52E1. Vias 50 further include curved edges 50E2 (FIG. 10B) that are overlapped by metal lines 52. In accordance with some embodiments, curved edges 50E2 are rounded, and may fit to circles 54, which are shown as being dashed.

FIGS. 11A, 11B, 12A, 12B, 13A and 13B, FIGS. 14A, 14B, 15A, 15B, 16A and 16B, and FIGS. 17A, 17B, 18A, 18B, 19A and 19B illustrate cross-sectional views of intermediate stages in the formation of self-aligned interconnect structures in accordance with alternative embodiments of the present disclosure. Unless specified otherwise, the materials and the formation processes of the components in these embodiments are essentially the same as the like components, which are denoted by like reference numerals in the preceding embodiments shown in preceding Figures. The details regarding the formation processes and the materials of the components shown in these embodiments may thus be found in the discussion of the preceding embodiments.

Figure 11A:
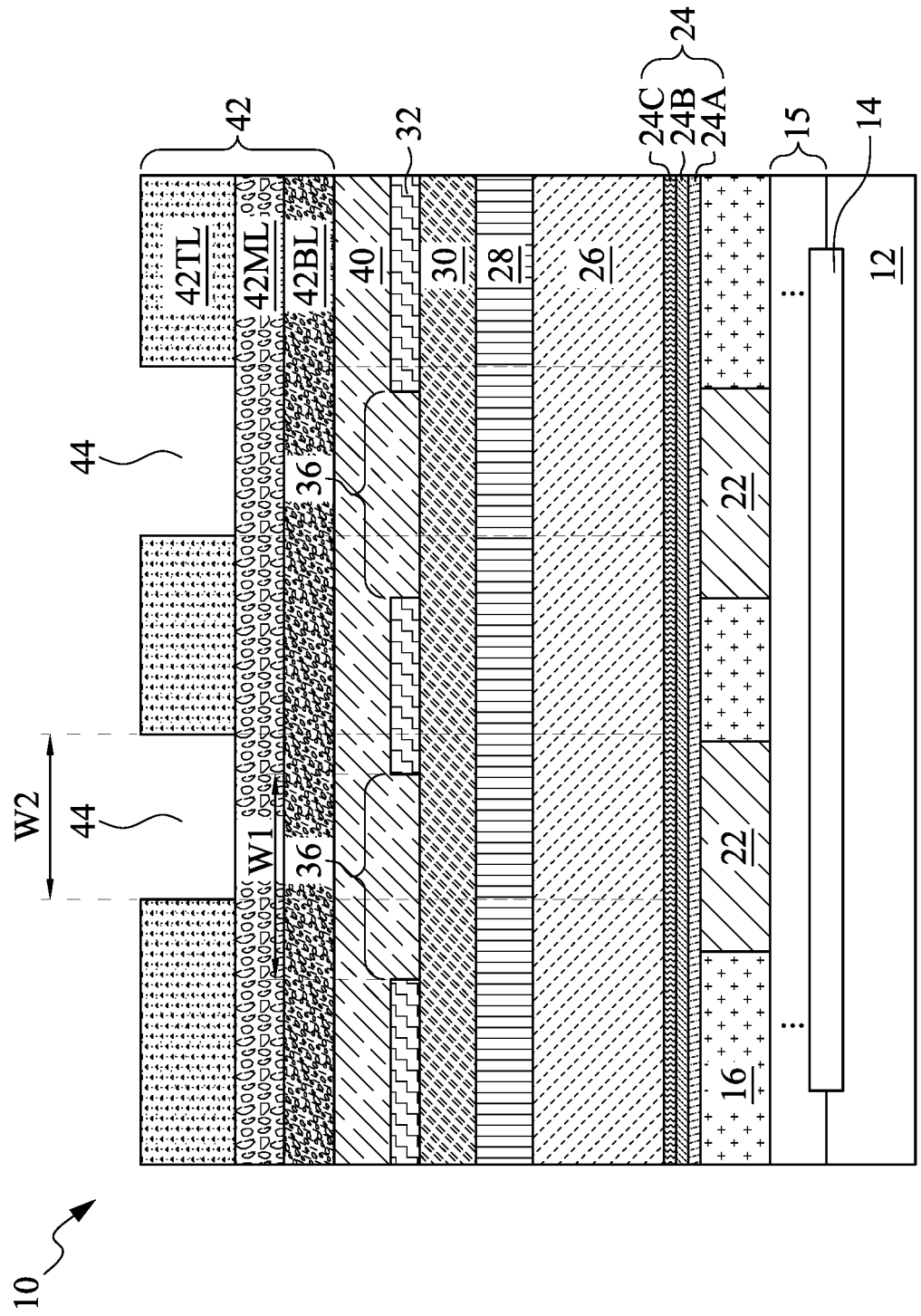

FIGS. 11A, 11B, 12A, 12B, 13A, and 13B illustrate some intermediate stages. These embodiments are similar to the preceding embodiments, except that trench patterns are vertically offset from the respective underlying via openings in one direction. The initial steps of these embodiments are essentially the same as shown in FIGS. 1, 2A, 2B, and 3. Next, as shown in FIGS. 11A and 11B (which illustrate a cross-sectional view and a top view, respectively), etching mask 42 is formed. Trenches 44 are formed in top layer 42TL. FIG. 11A illustrates the cross-section 11A-11A in FIG. 11B. In accordance with some embodiments, trenches 44 still have widths W2 smaller than the widths W1 of openings 36 in hard mask 32. Furthermore, trenches 44 are vertically offset from the respective underlying openings 36 due to overlay shift. Accordingly, instead of having openings 36 laterally extend beyond the opposite edges of the respective overlying trenches 44, openings 36 laterally extend beyond the edges of the respective overlying trenches 44 in the −X direction, and is recessed from the edges of the respective overlying trenches 44 in the +X direction.

Figure 12A:
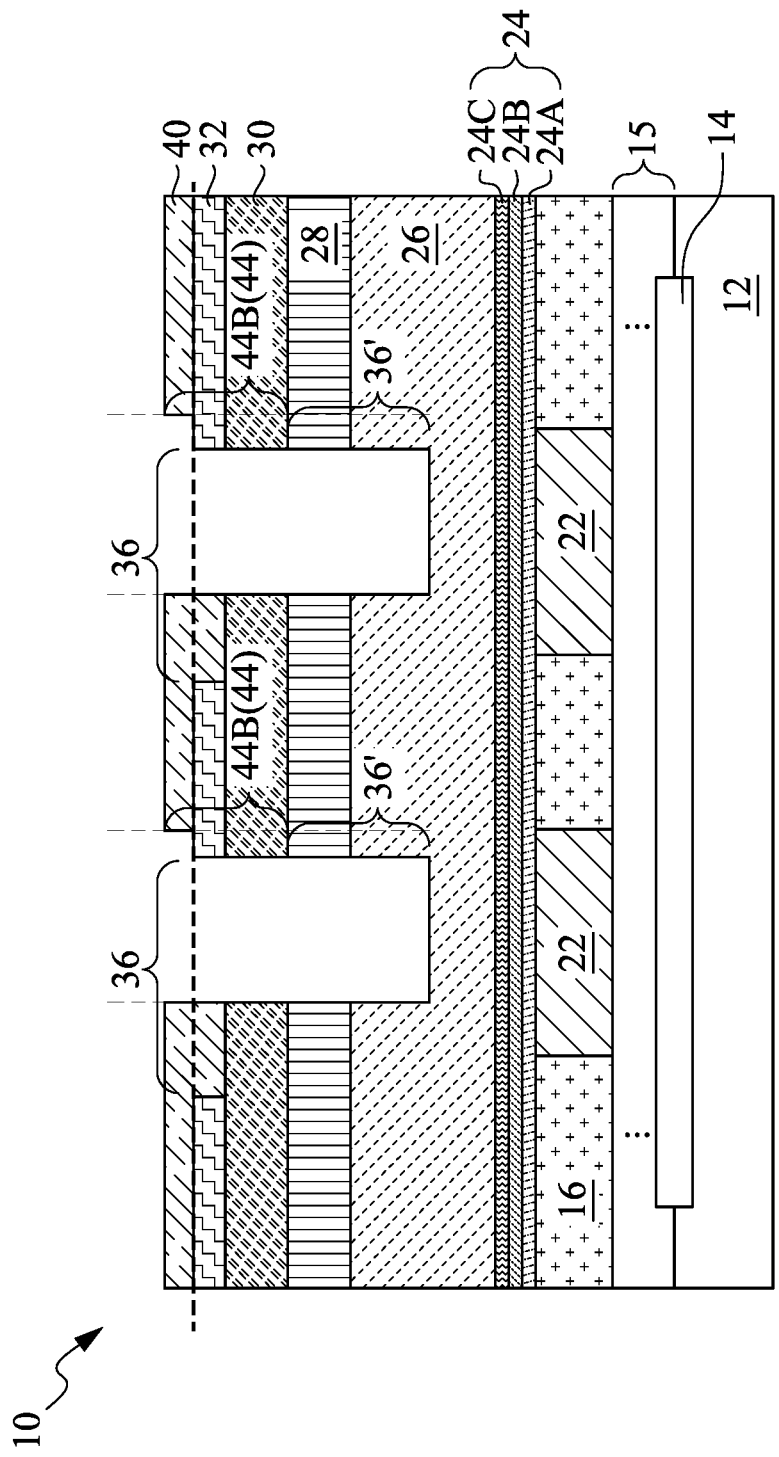

In subsequent processes, the processes shown in FIGS. 5A, 5B, 6, 7A and 7B are performed. The resulting structure is shown FIGS. 12A and 12B, which illustrate a cross-sectional view and a top view, respectively. FIG. 12A illustrates the cross-sectional 12A-12A in FIG. 12B. Via openings 36' are formed, and trenches 44 are extended into hard mask 30 through etching. FIGS. 12A and 12B correspond to FIGS. 7A and 7B, except that in the illustrate cross-section, trenches 44 in FIGS. 12A and 12B offset to the +X direction relative to the underlying via openings 36'. Trench portions 44A may be found in FIG. 12B, and is not shown in FIG. 12A.

Figure 13A:
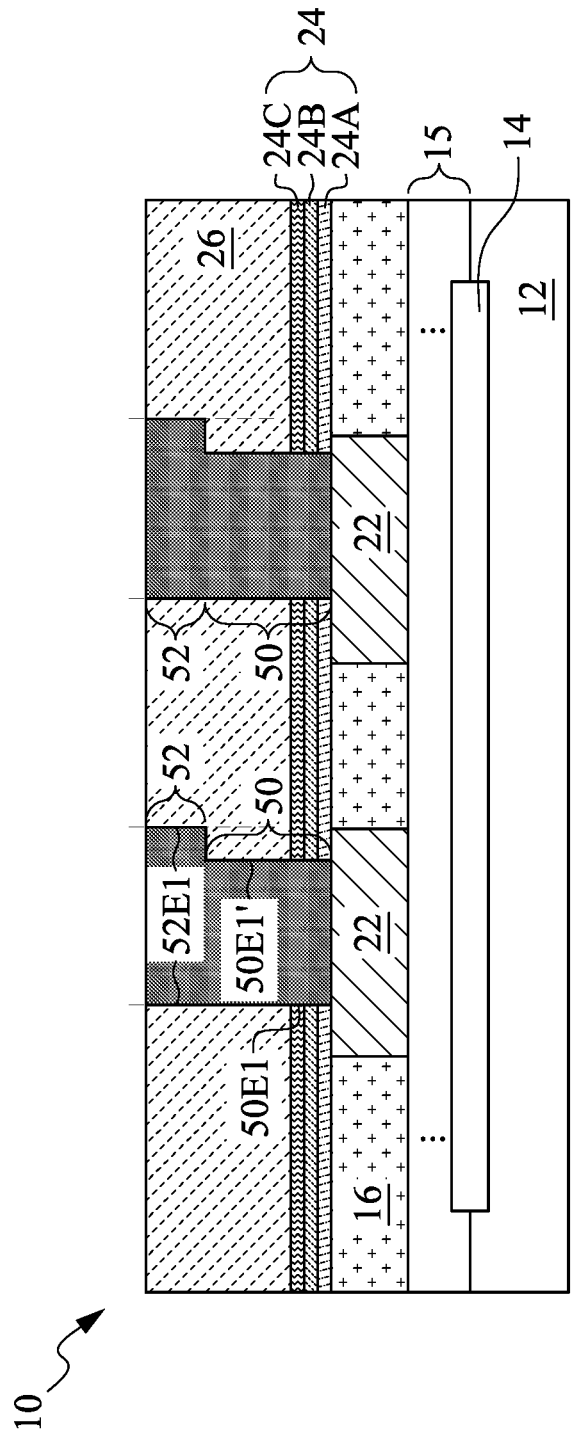
Figure 13B:
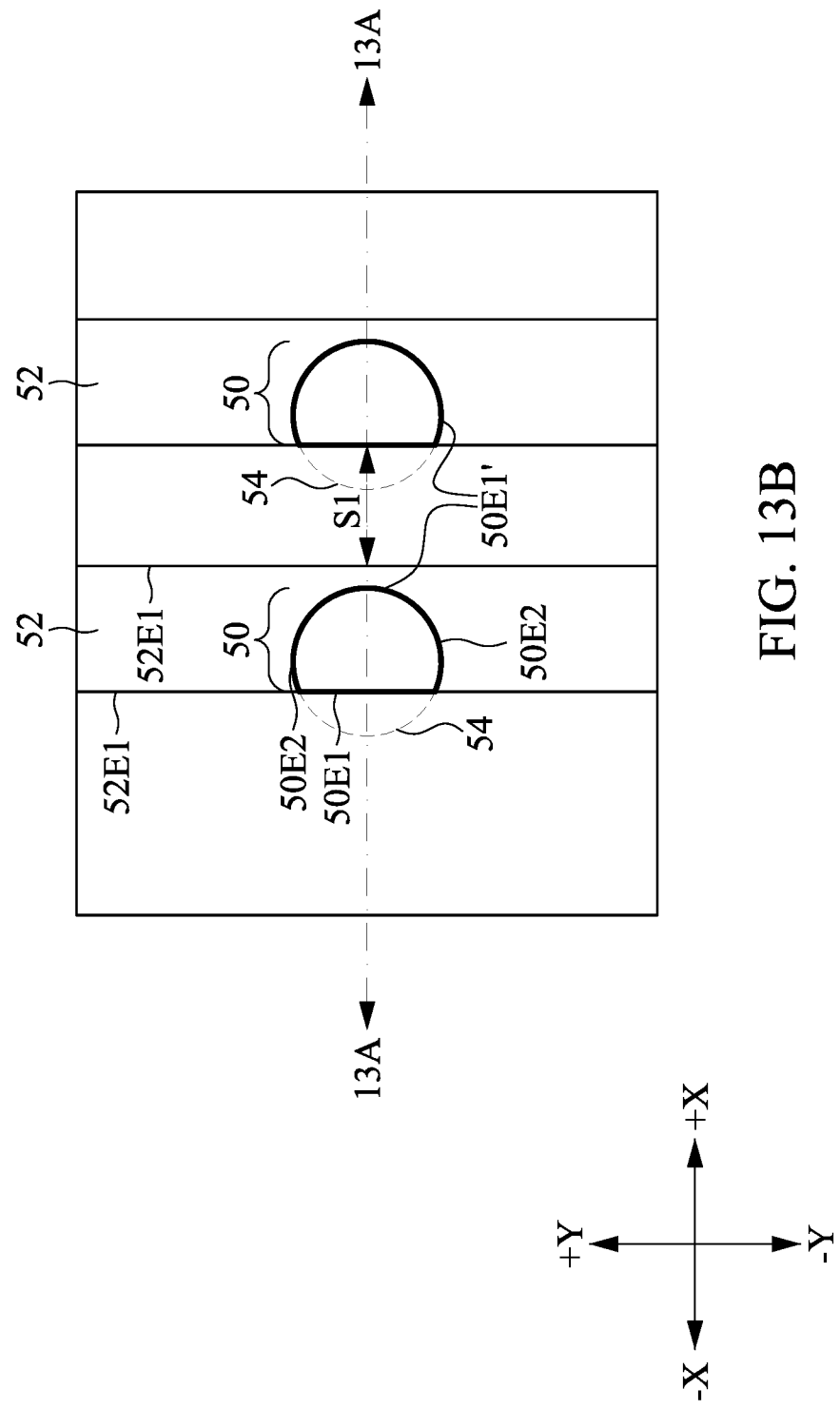

The subsequent processes are essentially the same as what have been shown and discussed referring to FIGS. 8, 9A, 9B, 10A, and 10B. The resulting vias 50 and metal lines 52 are shown in FIGS. 13A, and 13B, with FIG. 13A illustrating the cross-section 13A-13A in FIG. 13B. As shown in FIG. 13B, the left edges 50E1 of vias 50 are straight edges, which are vertically aligned to the left straight edges 52E1 of the corresponding metal line 52. The right edges 50E1' of vias 50 are already recessed from the corresponding right edges of metal lines 52, and are not confined by the corresponding trenches. Accordingly, the right edges 50E1' (in the X-direction, FIG. 13B) and the edge 50E2 in the +Y and −Y directions of vias 50 may be curved and rounded. In accordance with some embodiment, the right edges and the edge in the +Y and −Y directions may be parts of the same curved edge that fits circle 54. The width W1 of via opening 36' is smaller width W2 of trenches 44.

As shown in FIGS. 13A and 13B, when overlay shift occurs, and trench patterns are shifted from the corresponding via opening patterns, the spacing S1 between metal lines and neighboring vias remain not increased, unlike what happened in convention processes. This eliminates the possible problem of increased leakage between neighboring metal lines/vias due to the reduction of spacing.

Figure 14A:
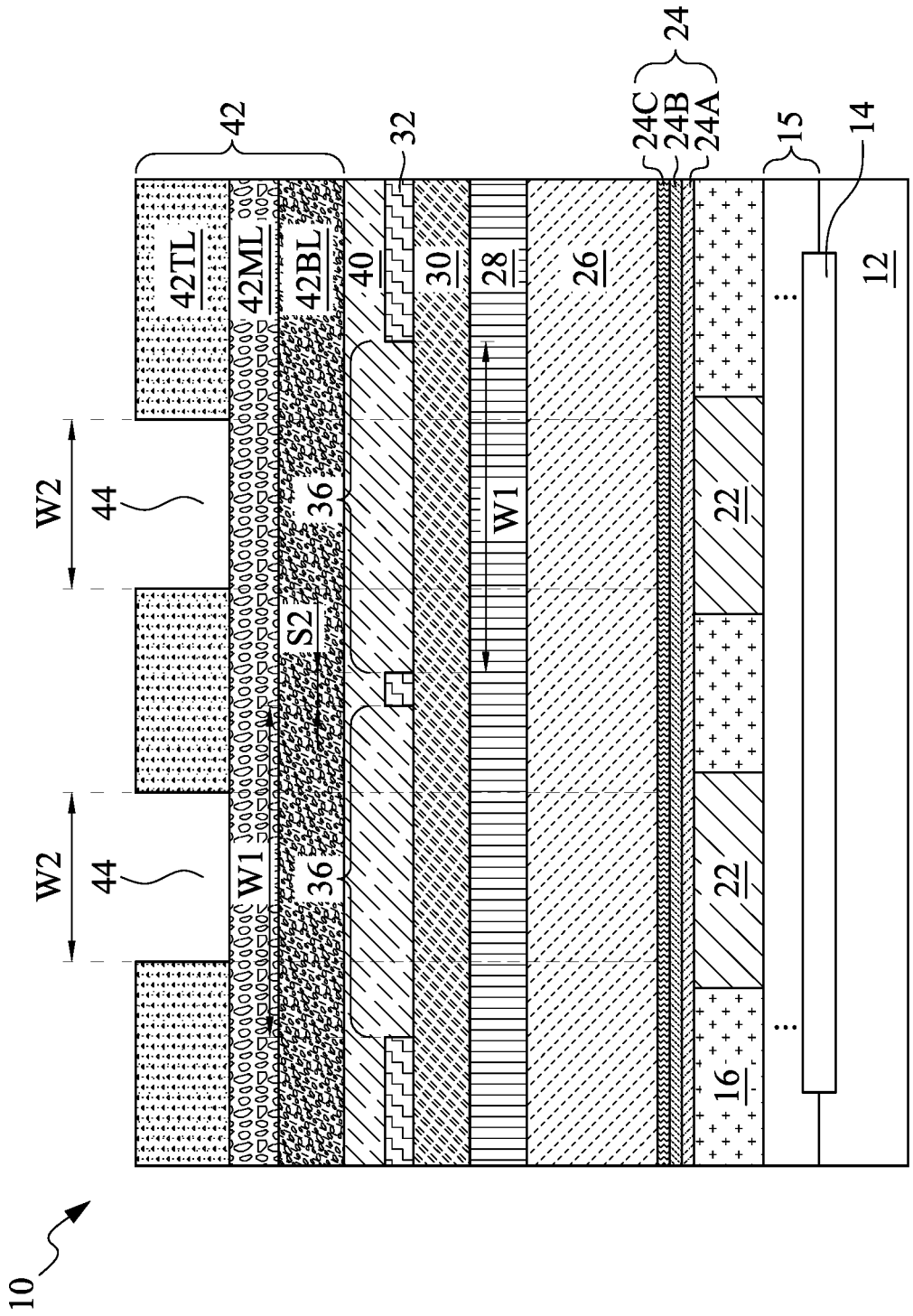
FIGS. 14A, 14B, 15A, 15B, 16A, and 16B illustrate the cross-sectional views and top views of intermediate stages in the formation of an interconnect structure in accordance with some embodiments.
Figure 14B:
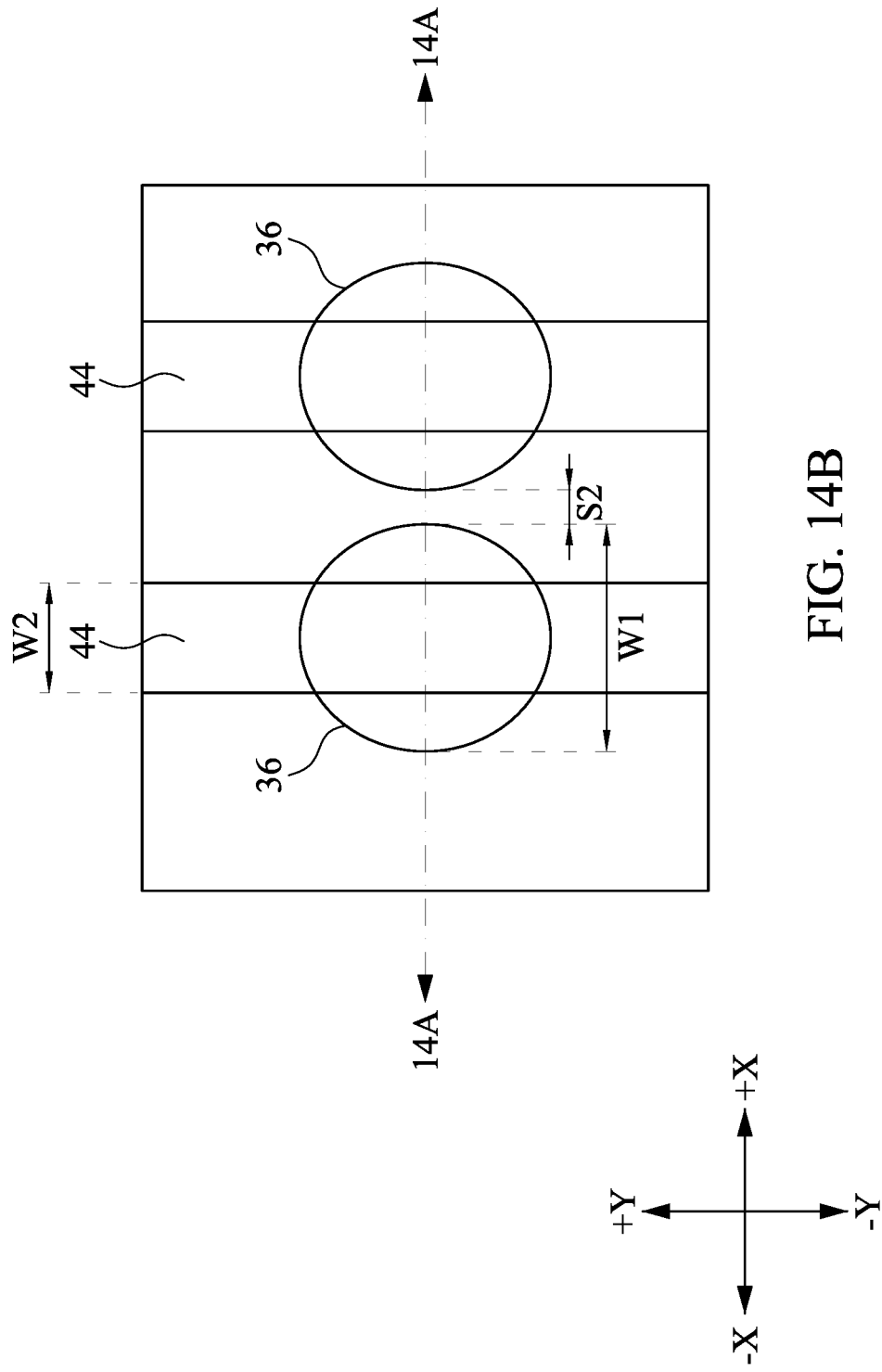

FIGS. 14A, 14B, 15A, 15B, 16A, and 16B illustrate some intermediate stages in accordance with alternative embodiments. These embodiments are similar to the preceding embodiments, except that the spacings of via openings are too small. The initial steps of these embodiments are essentially the same as shown in FIGS. 1, 2A, 2B, and 3. Next, as shown in FIGS. 14A and 14B, which illustrate a cross-sectional view and a top view, respectively, etching mask 42 is formed, with trenches 44 being formed in top layer 42TL. FIG. 14A illustrates the cross-section 14A-14A in FIG. 14B. In accordance with some embodiments, trenches 44 still have widths W2 smaller than the widths W1 of openings 36 in hard mask 32. The spacing S2 between neighboring openings 36, however, are too small. For example, a ratio S2/W2 may be smaller than about 1. Ratio S2/W1 may be smaller than about 0.7, wherein W1 is the width of via openings 36. Spacing S2 may also be smaller than about 25 nm.

Figure 15A:
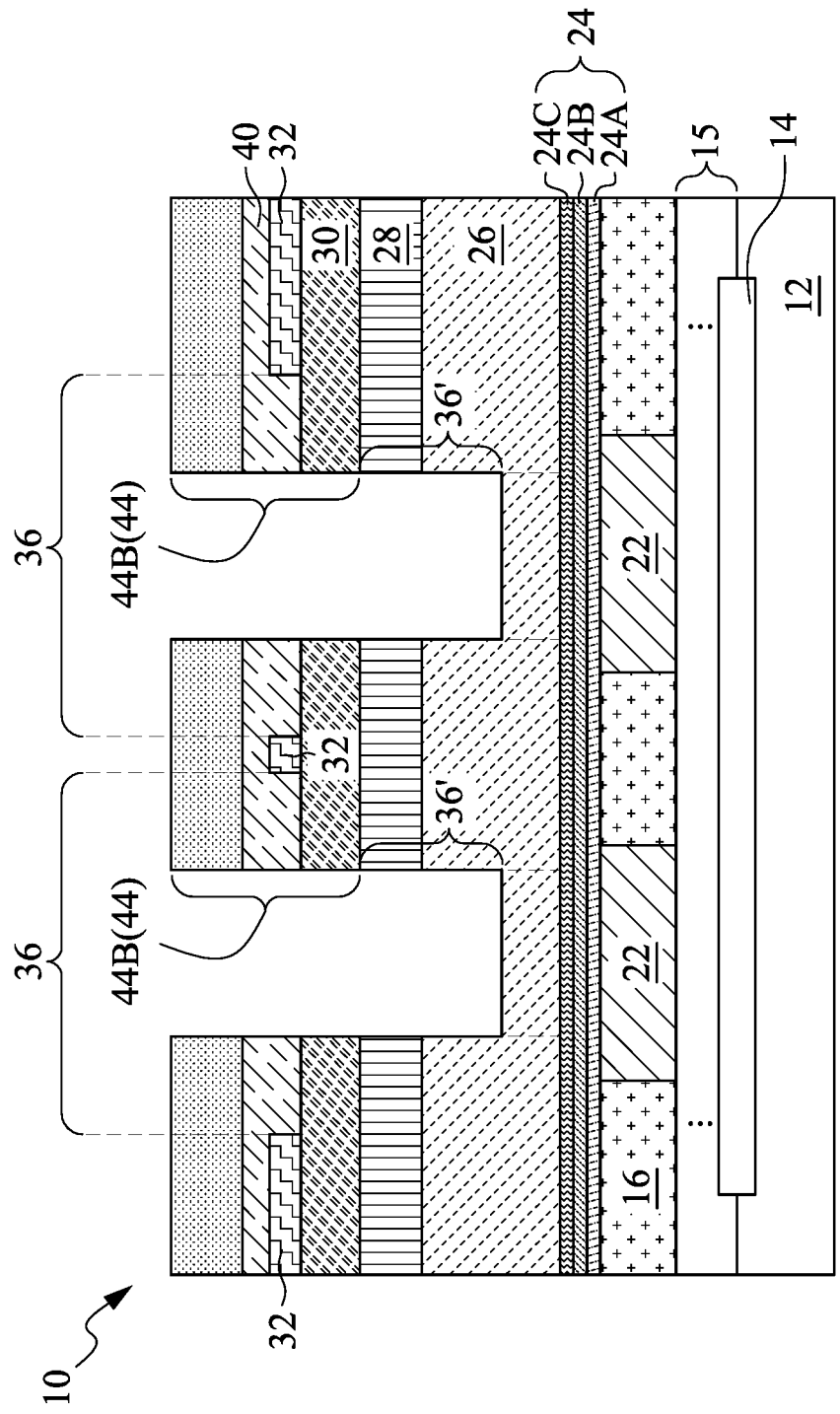
Figure 15B:
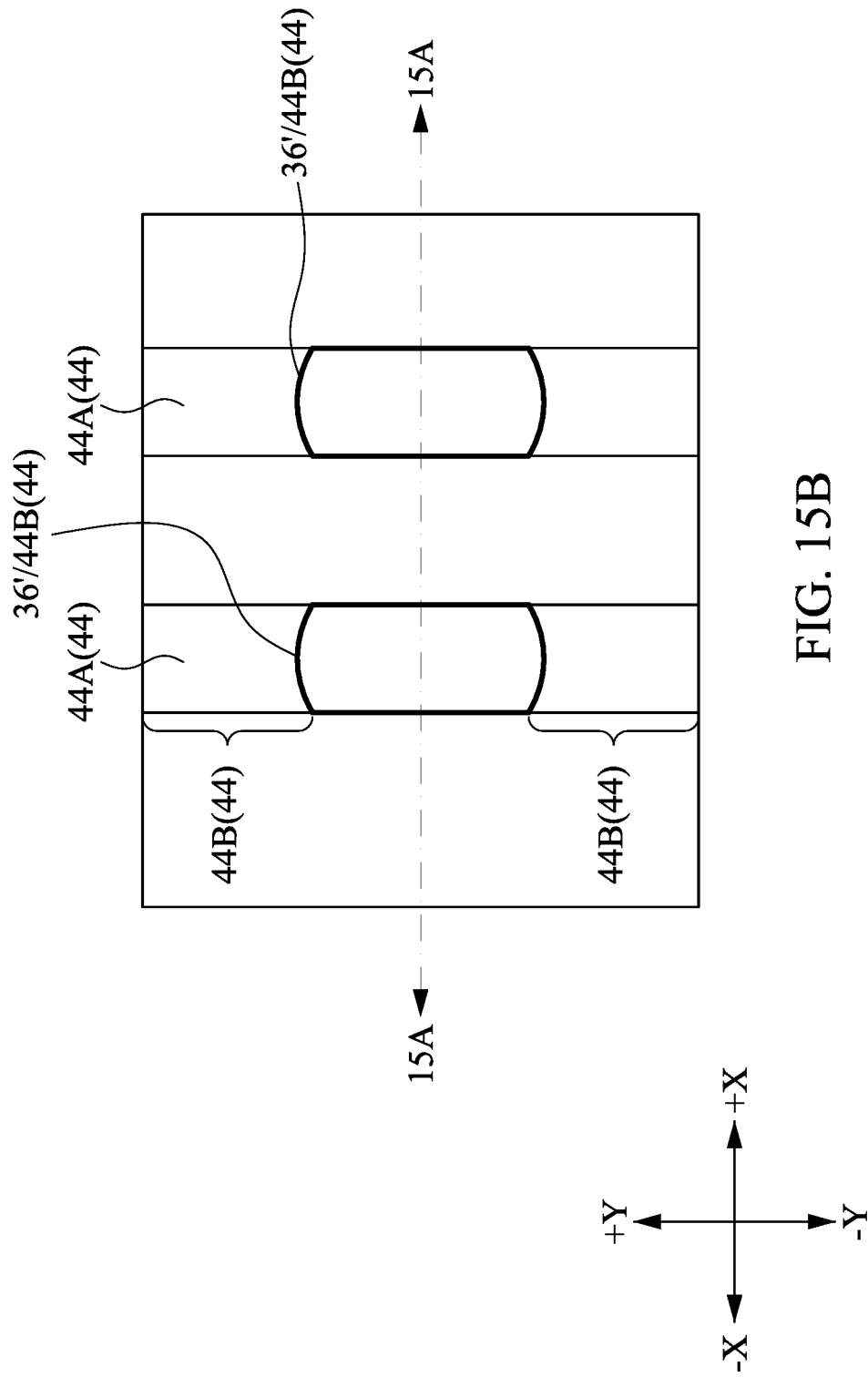

In subsequent processes, the processes shown in FIGS. 5A, 5B, 6, 7A, and 7B are performed. The resulting structure is shown in FIGS. 55A and 15B, which illustrate a cross-sectional view and a top view, respectively. FIG. 15A illustrates the cross-section 15A-15A in FIG. 15B. Via openings 36' are formed, and trenches 44 are extended into hard mask 30 through etching. FIGS. 15A and 15B correspond to FIGS. 7A and 7B.

Figure 16A:
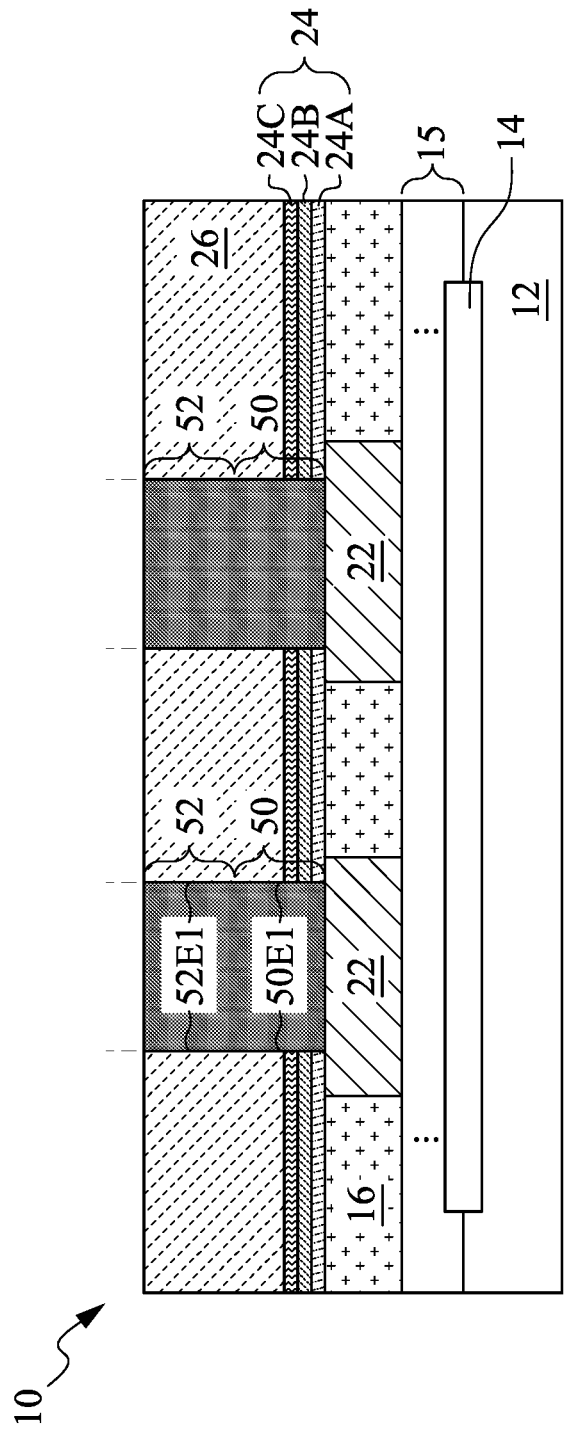
Figure 16B:
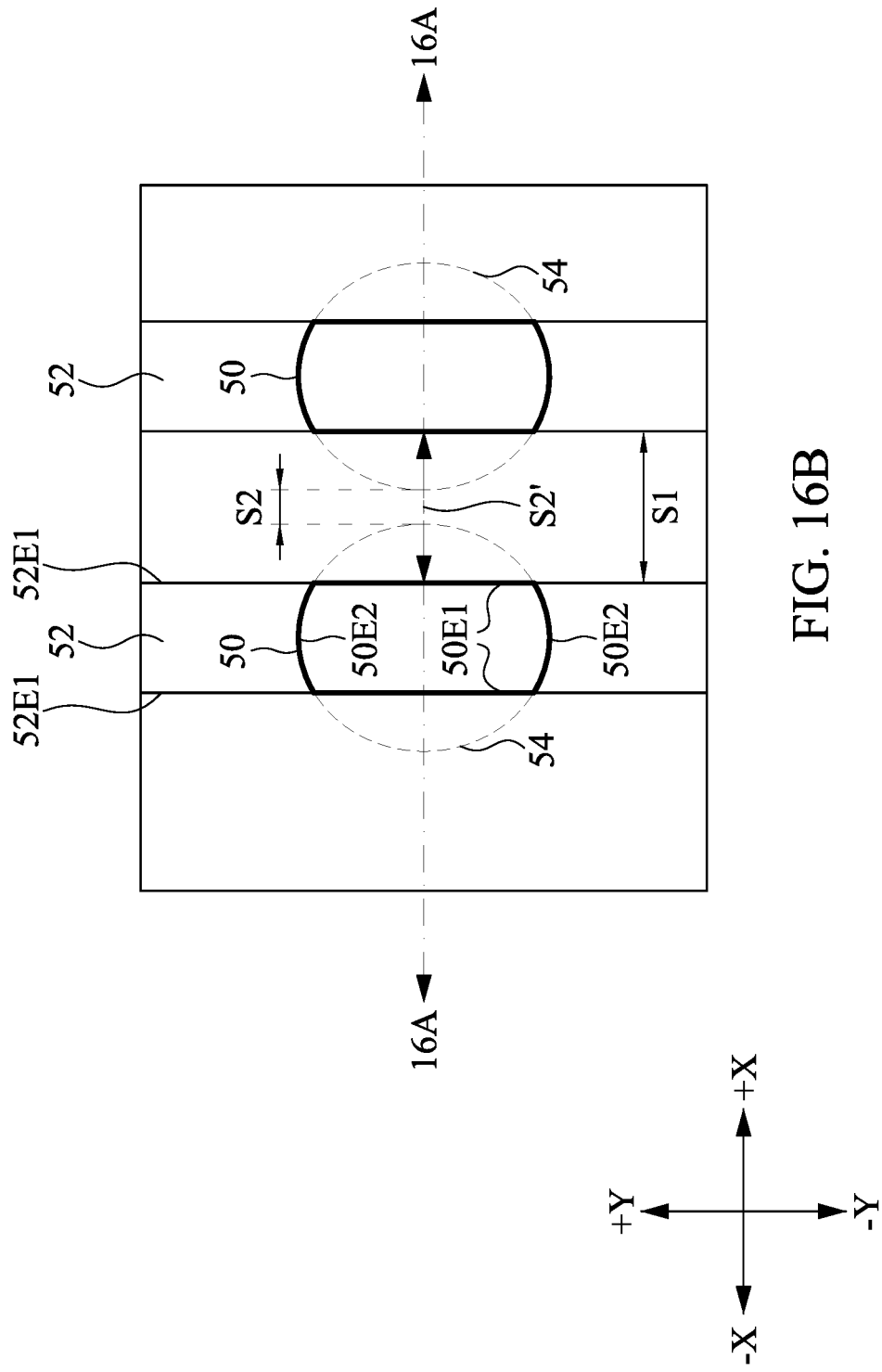

The subsequent processes are essentially the same as what have been shown and discussed referring to FIGS. 8, 9A, 9B, 10A, and 10B. The resulting vias 50 and metal lines 52 are shown in FIGS. 16A and 16B, with FIG. 16A illustrating the cross-section 16A-16A in FIG. 16B. As shown in FIG. 16B, both of the left edges 50E1 and right edges 50E1 of vias 50 are straight edges, which are vertically aligned to the straight edges 52E1 of the metal lines 52. The edges 50E2 in the +Y and −Y directions may be curved and rounded, and are overlapped by metal lines 52. The curved edges 50E2 are joined to the straight edges 50E1. In accordance with some embodiment, the curved edges 50E2 of vias 50 may fit circles 54, which have spacing S2.

As shown in FIGS. 16A and 16B, the spacing S2 between via openings are too small. If conventional formation processes are used, spacing S2 will be the spacing between metal lines 52 and their corresponding neighboring vias 50. The small spacing S2 may result in increased leakage or bridging of metal lines to neighboring vias. By adopting the embodiments of the present disclosure, the spacing S2' between metal lines and neighboring vias is defined by the spacings S1 between neighboring metal lines 52, and spacing S2' is not increased due to the enlargement of via patterns. This eliminates the possible problem of increased leakage and bridging.

Figure 17A:
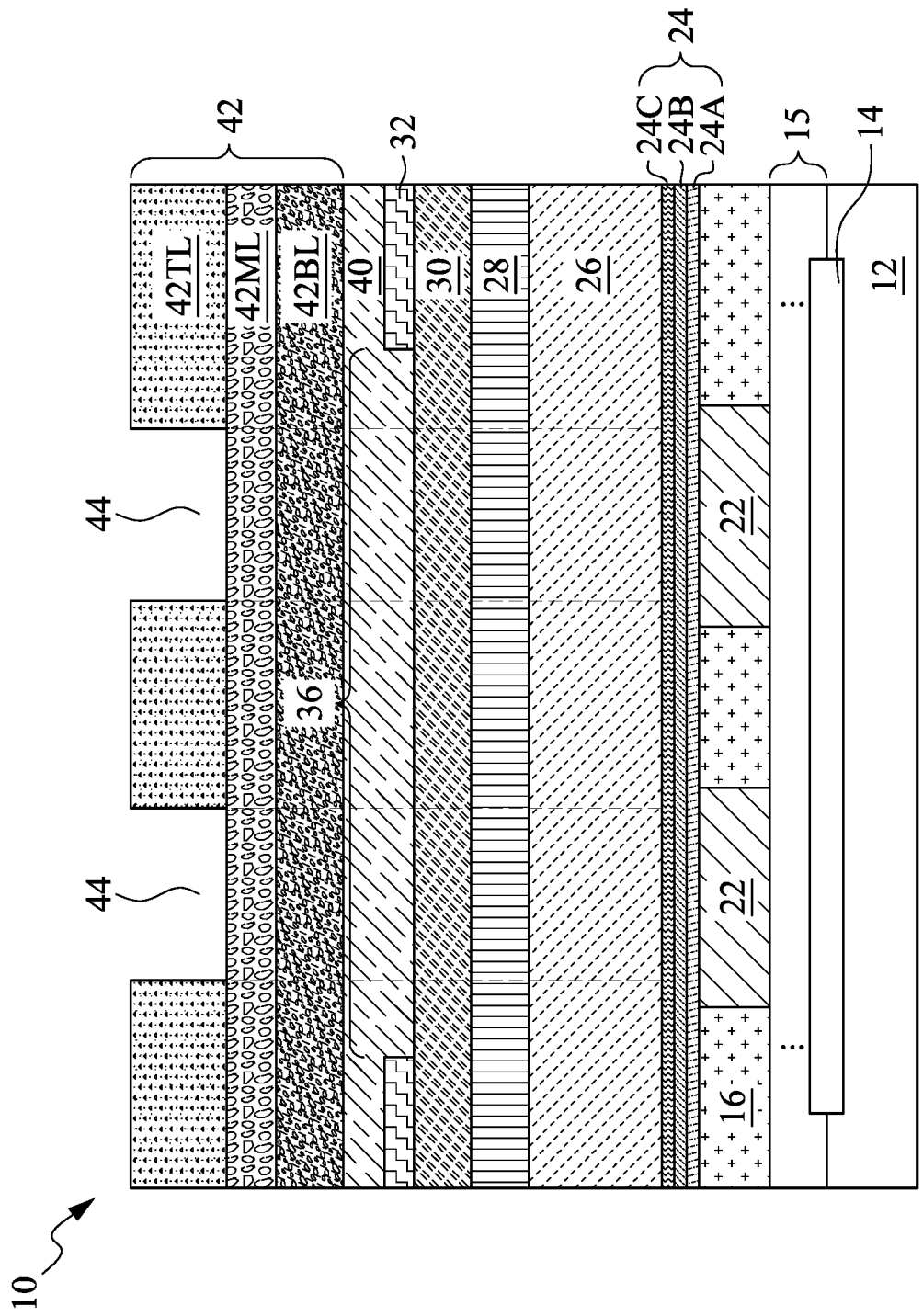
FIGS. 17A, 17B, 18A, 18B, 19A, and 19B illustrate the cross-sectional views and top views of intermediate stages in the formation of an interconnect structure in accordance with some embodiments.
Figure 17B:
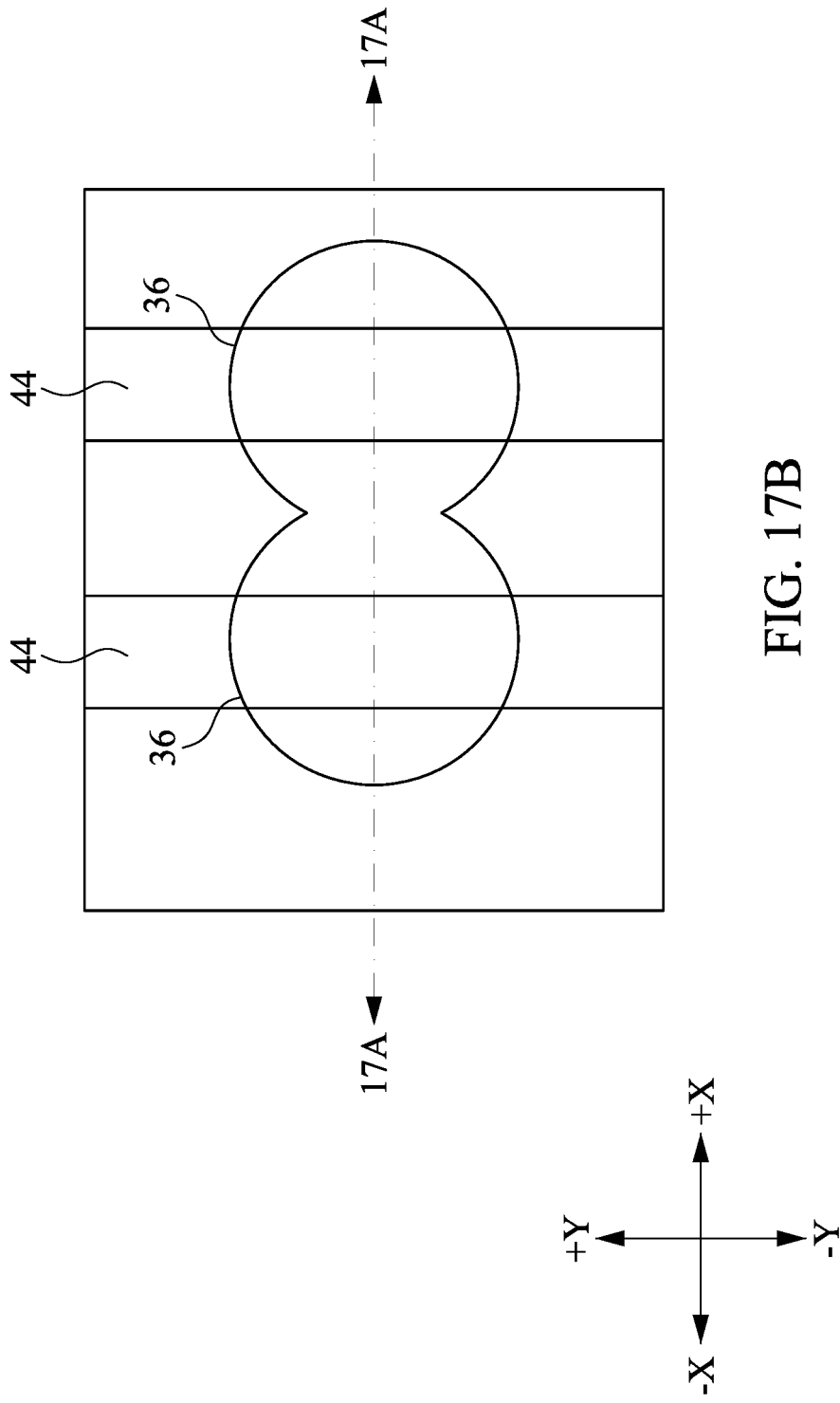

FIGS. 17A, 17B, 18A, 18B, 19A, and 19B illustrate some intermediate stages in accordance with alternative embodiments. These embodiments are similar to the preceding embodiments, except that neighboring via openings in hard mask 32 are so large that they join to each other. The initial steps of these embodiments are essentially the same as shown in FIGS. 1, 2A, 2B, and 3. The resulting structure is shown in FIGS. 17A and 17B, which illustrate a cross-sectional view and a top view, respectively. FIG. 17A illustrates the cross-section 17A-17A in FIG. 17B. FIG. 17B shows the large opening including two joined openings 36. The joint of neighboring openings 36 may be caused by optical effect, wherein small via openings which have small dimensions in both of X-directions and Y-direction may be enlarged to be larger than the patterns in the respective lithography mask. Next, etching mask 42 is formed, with trenches 44 being formed in top layer 42TL.

Figure 18A:
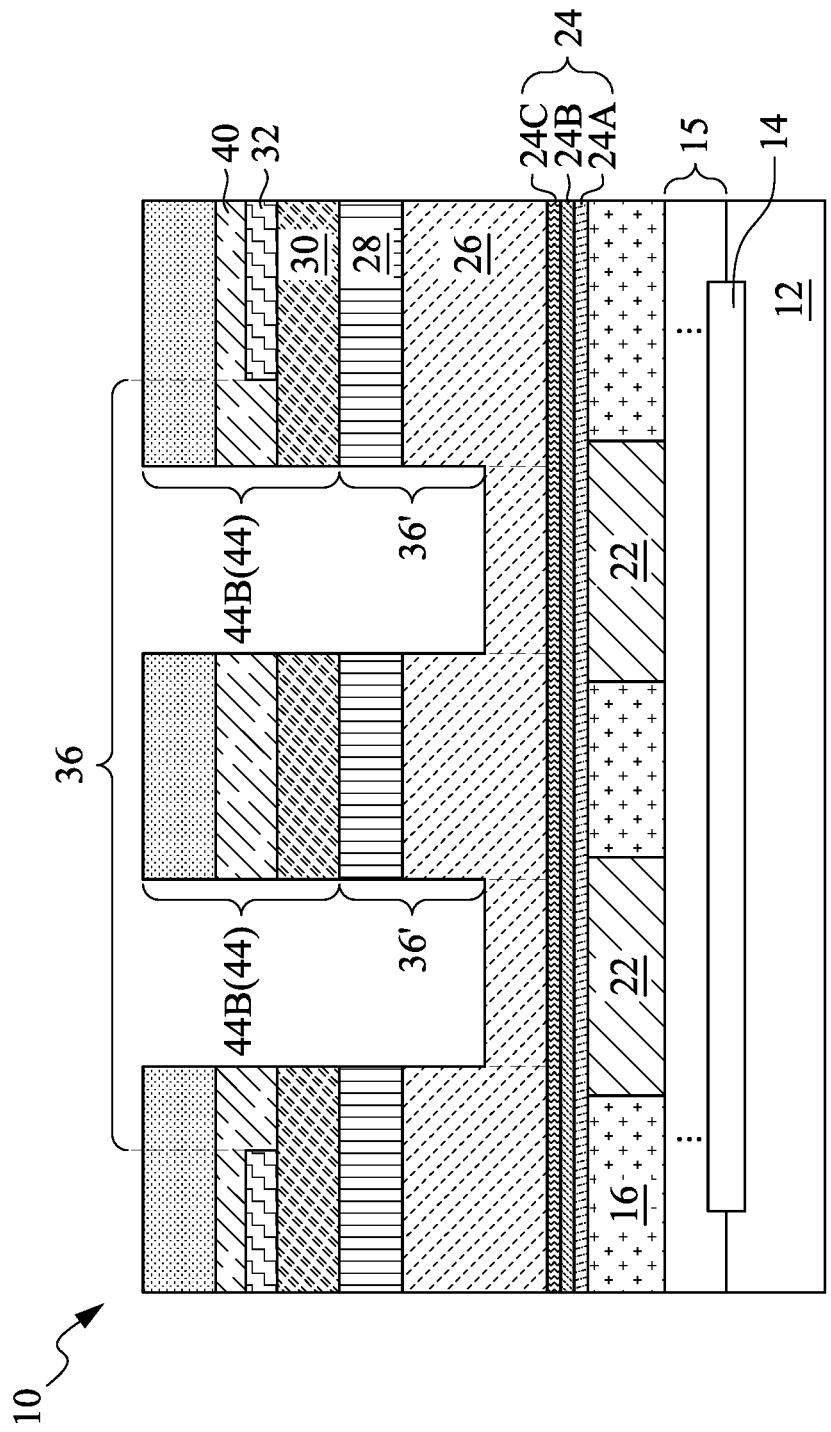
Figure 18B:
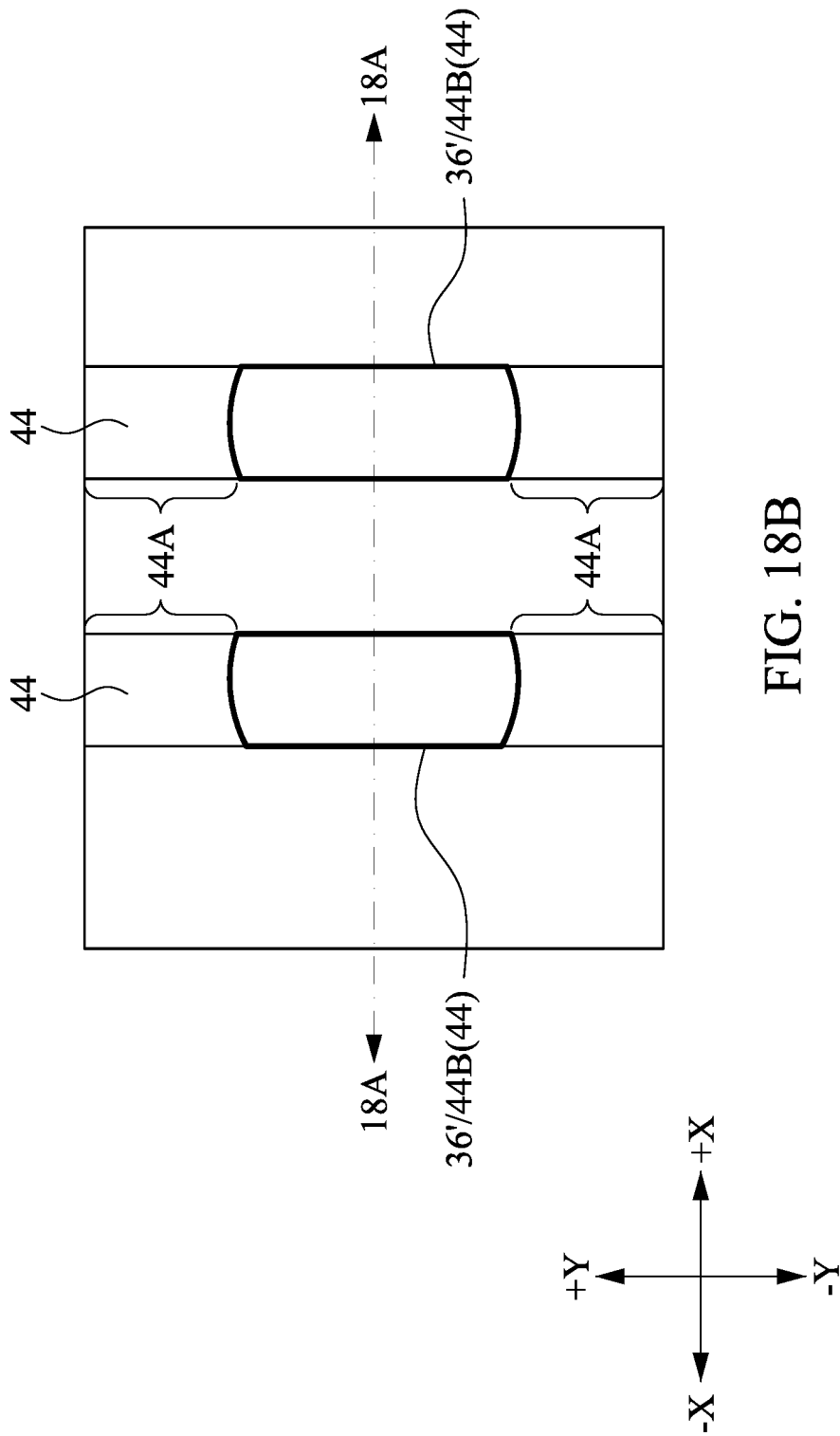

In subsequent processes, the processes shown in FIGS. 5A, 5B, 6, 7A, and 7B are performed. The resulting structure is shown in FIGS. 18A and 18B, which illustrate a cross-sectional view and a top view, respectively. FIG. 18A illustrates the cross-section 18A-18A in FIG. 18B. Via openings 36' are formed, and trenches 44 are extended into hard mask 30 through etching. FIGS. 18A and 18B correspond to FIGS. 7A and 7B.

Figure 19A:
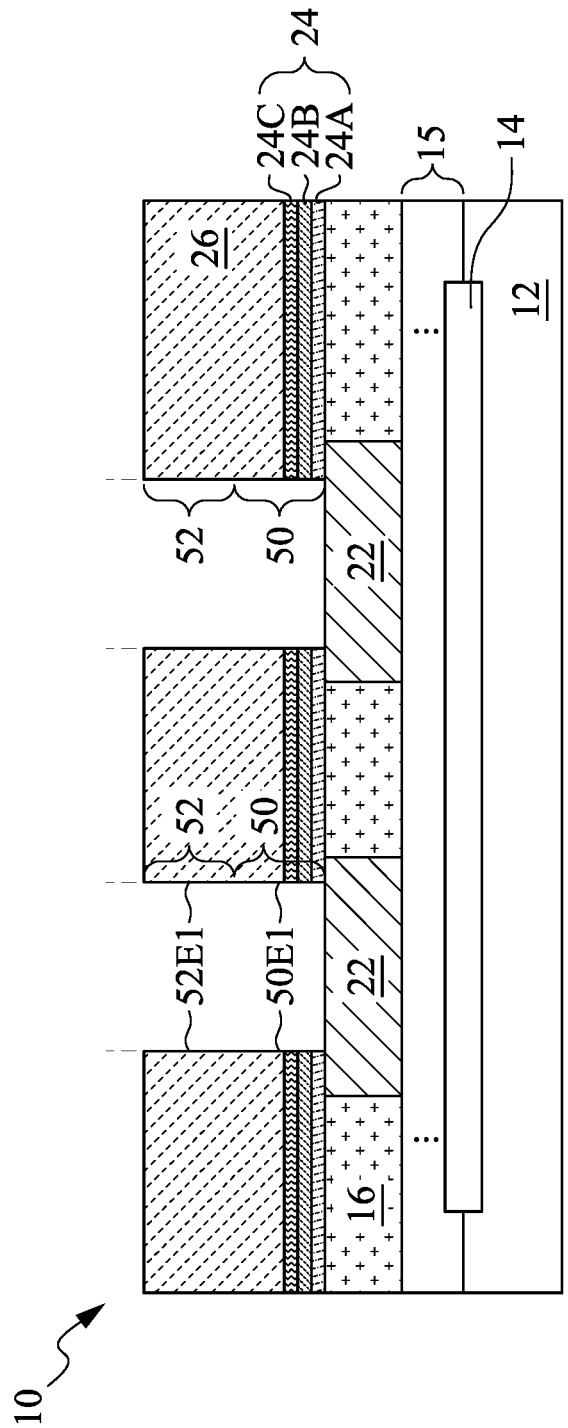
Figure 19B:
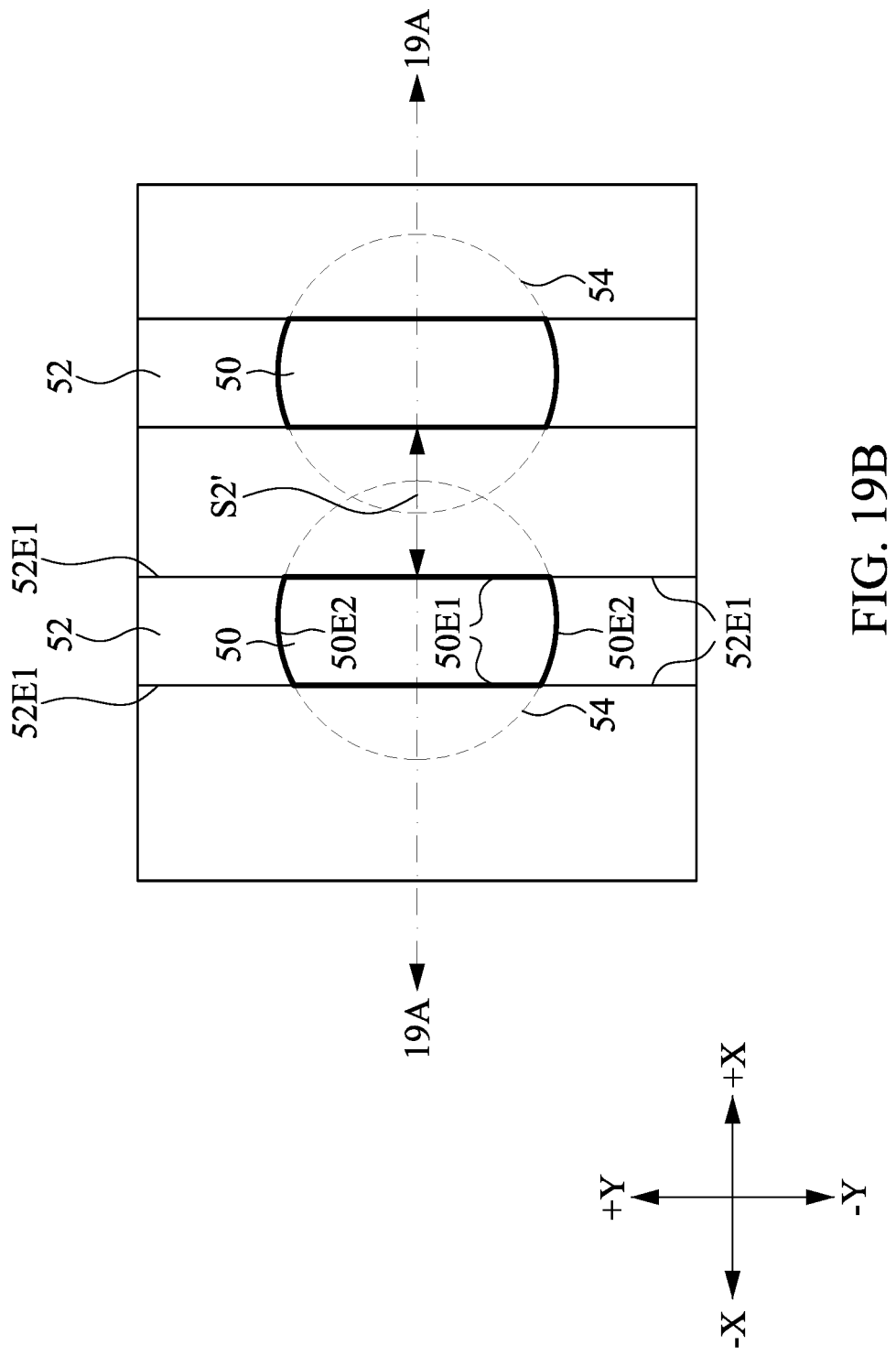

The subsequent processes are essentially the same as what have been shown and discussed referring to FIGS. 8, 9A, 9B, 10A, and 10B. The resulting vias 50 and metal lines 52 are shown in FIGS. 19A and 19B, with FIG. 19A illustrating the cross-section 19A-19A in FIG. 19B. Both of he left edges 50E1 and right edges 50E1 of vias 50 are straight edges, which are vertically aligned to the straight edges 52E1 of the respective overlying metal lines 52. The edges 50E2 of vias 50 may be curved and rounded, and are overlapped by the overlying metal lines 52. In accordance with some embodiment, curved edges 50E2 may fit circles 54, which at least contact with each other, or may partially overlap with each other. By adopting the embodiments in the present disclosure, the spacing S2' of metal lines to neighboring vias is equal to the spacings S1 between neighboring metal lines. The bridging problem of metal lines to neighboring vias which occur in conventional formation processes is eliminated.

The embodiments of the present disclosure have some advantageous features. By adopting a via-first approach, with via opening patterns in a first hard mask being combined with trench patterns in a second hard mask to define the edges of conductive vias, the conductive vias have their edges confined by the edges of the corresponding overlying metal lines. Accordingly, the spacings between metal lines and their neighboring vias are not increased regardless of how much wider the via opening patterns are than the corresponding trench patterns. The leakage and the potential bridging between neighboring metal lines and vias are thus eliminated.

In accordance with some embodiments of the present disclosure, a method comprises forming a dielectric layer over a substrate; forming a first hard mask over the dielectric layer; forming a second hard mask over the first hard mask; etching the second hard mask to form a first opening in the second hard mask, wherein the first opening has a first width; forming a third hard mask over the second hard mask and filling the first opening; etching the third hard mask and the first hard mask to form a trench in the third hard mask and a second opening in the first hard mask, wherein the trench comprises a portion directly above the first opening, wherein the first opening is directly above the second opening, and wherein the trench has a second width that is less than the first width of the first opening, and the second opening has a third width that is smaller than or equal to the second width of the trench; performing a first etching process on the dielectric layer to extend the trench and the second opening into the dielectric layer; and forming a metal line and a via in the trench and the second opening, respectively. In an embodiment, the first opening extends laterally beyond the second opening in a first direction perpendicular to a lengthwise direction of the trench. In an embodiment, the first opening extends laterally beyond the second opening in a second direction perpendicular to the lengthwise direction of the trench, and wherein the first direction and the second direction are opposite to each other. In an embodiment, the first opening is recessed from a corresponding edge of the trench in a second direction perpendicular to the lengthwise direction of the trench, wherein the first direction and the second direction are opposite to each other. In an embodiment, the method further comprises forming a fourth hard mask over the dielectric layer, wherein the first hard mask is formed over the fourth hard mask, and wherein in the etching the third hard mask and the first hard mask to form the trench, the fourth hard mask is used as an etch stop layer. In an embodiment, the method further comprises performing a second etching process on the dielectric layer to extend the second opening into a top portion of the dielectric layer and to form a via opening, wherein in the etching the dielectric layer, the fourth hard mask is used as an etching mask. In an embodiment, the method further comprises etching the fourth hard mask to extend the trench penetrating through the fourth hard mask, wherein the first etching process on the dielectric layer is performed after both of the second etching process on the dielectric layer and the etching the fourth hard mask are performed. In an embodiment, during the etching the fourth hard mask, the dielectric layer is not etched. In an embodiment, the metal line comprises a first edge and a second edge extending along a lengthwise direction of the metal line, and wherein the first edge and the second edge are opposite to each other, and wherein the via comprises a third edge and a fourth edge parallel to each other and vertically aligned to the first edge and the second edge, respectively. In an embodiment, the metal line comprises a first edge and a second edge extending to a lengthwise direction of the metal line, and wherein the first edge and the second edge are opposite to each other, and wherein the via comprises a third edge underlying and vertically aligned to the first edge of the metal line; and a fourth edge vertically aligned to a position between the first edge and the second edge.

In accordance with some embodiments of the present disclosure, a structure comprises a dielectric layer; a metal line in the dielectric layer, wherein the metal line comprises a first straight edge and a second straight edge extending in a lengthwise direction of the metal line, wherein the first straight edge and the second straight edge are parallel to each other; and a via underlying and joined to the metal line, wherein the via comprises a third straight edge underlying and vertically aligned to the first straight edge; and a first curved edge and a second curved edge connecting to opposite ends of the third straight edge. In an embodiment, the metal line extends laterally beyond the first curved edge and the second curved edge in the lengthwise direction. In an embodiment, the via further comprises a fourth straight edge underlying and vertically aligned to the second straight edge, wherein the first curved edge and the second curved edge are further connected to opposite ends of the fourth straight edge. In an embodiment, the via comprises a curved edge, with the first curved edge and the second curved edge being parts of the curved edge, and the opposite ends of the third straight edge is connected to the curved edge. In an embodiment, an entirety of the curved edge is continuously curved. In an embodiment, the first curved edge fits a circle.

In accordance with some embodiments of the present disclosure, a structure comprises a first metal line and a second metal line adjacent to and parallel to each other; a first via underlying the first metal line, wherein an entirety of the first via is in a first region directly underlying the first metal line, and the first via comprises a first curved edge directly underlying the first metal line; and a first straight edge vertically aligned to an edge of the first metal line, wherein the first straight edge is joined to the first curved edge; and a second via underlying the second metal line, wherein an entirety of the second via is in a second region directly underlying the second metal line, and the second via comprises a second curved edge directly underlying the second metal line; and a second straight edge vertically aligned to an additional edge of the second metal line, wherein the second straight edge is joined to the second curved edge. In an embodiment, the first curved edge fits a first circle, and the second curved edge fits a second circle. In an embodiment, the first circle at least touches or partially overlaps the second circle. In an embodiment, the first via further comprises a third curved edge, wherein the first curved edge and the third curved edge are joined to opposite ends of the first straight edge, wherein the third curved edge is overlapped by the first metal line, and the first metal line extends laterally beyond both of the first curved edge and the third curved edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dielectric layer over a substrate;
    forming a first hard mask over the dielectric layer;
    forming a second hard mask over the first hard mask;
    etching the second hard mask to form a first opening in the second hard mask, wherein the first opening has a first width;
    forming a third hard mask over the second hard mask and filling the first opening;
    etching the third hard mask and the first hard mask to form a trench in the third hard mask and a second opening in the first hard mask, wherein the trench comprises a portion directly above the first opening, wherein the first opening is directly above the second opening, and wherein the trench has a second width that is less than the first width of the first opening, and the second opening has a third width that is smaller than or equal to the second width of the trench;
    performing a first etching process on the dielectric layer to extend the trench and the second opening into the dielectric layer; and
    forming a metal line and a via in the trench and the second opening, respectively.

2. The method of claim 1, wherein the first opening extends laterally beyond the second opening in a first direction perpendicular to a lengthwise direction of the trench.

3. The method of claim 2, wherein the first opening extends laterally beyond the second opening in a second direction perpendicular to the lengthwise direction of the trench, and wherein the first direction and the second direction are opposite to each other.

4. The method of claim 2, wherein the first opening is recessed from a corresponding edge of the trench in a second direction perpendicular to the lengthwise direction of the trench, wherein the first direction and the second direction are opposite to each other.

5. The method of claim 1 further comprising forming a fourth hard mask over the dielectric layer, wherein the first hard mask is formed over the fourth hard mask, and wherein in the etching the third hard mask and the first hard mask to form the trench, the fourth hard mask is used as an etch stop layer.

6. The method of claim 5 further comprising, performing a second etching process on the dielectric layer to extend the second opening into a top portion of the dielectric layer and to form a via opening, wherein in the etching the dielectric layer, the fourth hard mask is used as an etching mask.

7. The method of claim 6 further comprising:
    etching the fourth hard mask to extend the trench penetrating through the fourth hard mask, wherein the first etching process on the dielectric layer is performed after both of the second etching process on the dielectric layer and the etching the fourth hard mask are performed.

8. The method of claim 7, wherein during the etching the fourth hard mask, the dielectric layer is not etched.

9. The method of claim 1, wherein the metal line comprises a first edge and a second edge extending along a lengthwise direction of the metal line, and wherein the first edge and the second edge are opposite to each other, and wherein the via comprises a third edge and a fourth edge parallel to each other and vertically aligned to the first edge and the second edge, respectively.

10. The method of claim 1, wherein the metal line comprises a first edge and a second edge extending to a lengthwise direction of the metal line, and wherein the first edge and the second edge are opposite to each other, and wherein the via comprises:
    a third edge underlying and vertically aligned to the first edge of the metal line; and
    a fourth edge vertically aligned to a position between the first edge and the second edge.

11. A method comprising:
    etching a dielectric layer to form:
        a trench, wherein the dielectric layer comprises a first edge and a second edge facing the trench and parallel to a lengthwise direction of the trench; and
        a via opening underlying and connected to the trench, wherein the dielectric layer further comprises:

a third edge and a fourth edge facing the via opening, wherein the third edge and the fourth edge are vertically aligned to the first edge and the second edge, respectively; and a first curved edge connecting the third edge to the fourth edge; and filling the trench and the via opening to form a metal line and a via, respectively.

12. The method of claim 11, wherein the dielectric layer further comprises a second curved edge connecting the third edge to the fourth edge.

13. The method of claim 12, wherein the first curved edge and the second curved edge fit a same circle.

14. The method of claim 12, wherein the first curved edge and the second curved edge have a first distance, and the third edge and the fourth edge have a second distance smaller than the first distance.

15. The method of claim 11, wherein the forming the via opening and the trench comprises:

forming a first pattern of the via opening in a hard mask; and performing a first etching process to etch the dielectric layer and to form the via opening extending to an intermediate level between a top surface and a bottom surface of the dielectric layer, wherein in the first etching process, the hard mask is used as a first etching mask, and wherein in the first etching process, a second pattern of the trench is formed in the hard mask.

16. The method of claim 15 further comprising performing a second etching process to:

extend the via opening to the bottom surface of the dielectric layer; and transfer the second pattern into the dielectric layer to form the trench.

17. The method of claim 11, wherein the metal line extends laterally beyond the first curved edge in the lengthwise direction.

18. The method of claim 11, wherein an entirety of the first curved edge is continuously curved.

19. A method comprising:

forming a first metal line comprising a first straight edge parallel to a lengthwise direction of the first metal line; and forming a first via overlapped by the first metal line, wherein an entirety of the first via is directly underlying the first metal line, and the first via comprises:

a first curved edge overlapped by the first metal line; and a second straight edge vertically aligned to the first straight edge of the first metal line, wherein the second straight edge is joined to the first curved edge.

20. The method of claim 19 further comprising:

forming a second metal line adjacent to the first metal line, wherein the second metal line comprises a third straight edge parallel to the first straight edge; and forming a second via overlapped by the second metal line, wherein the second via comprises:

a second curved edge overlapped by the second metal line; and a fourth straight edge vertically aligned to the third straight edge of the second metal line, wherein the fourth straight edge is joined to the second curved edge.

* * * * *